United States Patent
Wu et al.

(10) Patent No.: US 11,476,232 B2
(45) Date of Patent: Oct. 18, 2022

(54) THREE-DIMENSIONAL PACKAGING TECHNIQUES FOR POWER FET DENSITY IMPROVEMENT

(71) Applicant: Analog Devices International Unlimited Company, Limerick (IE)

(72) Inventors: Albert M. Wu, Colorado Springs, CO (US); John David Brazzle, Tracy, CA (US); Zafer Kutlu, Menlo Park, CA (US)

(73) Assignee: Analog Devices International Unlimited Company, Limerick (IE)

( * ) Notice: Subject to any disclaimer, the term of this patent is extended or adjusted under 35 U.S.C. 154(b) by 49 days.

(21) Appl. No.: 16/817,203

(22) Filed: Mar. 12, 2020

(65) Prior Publication Data

US 2020/0312814 A1 Oct. 1, 2020

Related U.S. Application Data

(60) Provisional application No. 62/823,242, filed on Mar. 25, 2019.

(51) Int. Cl.
| | | |
|---|---|---|
| H01L 25/065 | (2006.01) | |
| H01L 25/00 | (2006.01) | |
| H01L 21/56 | (2006.01) | |
| H01L 23/31 | (2006.01) | |

(52) U.S. Cl.
CPC ........ *H01L 25/0655* (2013.01); *H01L 21/565* (2013.01); *H01L 23/3121* (2013.01); *H01L 25/50* (2013.01)

(58) Field of Classification Search
None
See application file for complete search history.

(56) References Cited

U.S. PATENT DOCUMENTS

| | | | |
|---|---|---|---|
| 7,271,477 | B2 | 9/2007 | Saito et al. |
| 7,768,123 | B2 | 8/2010 | Liu et al. |
| 7,829,989 | B2 | 11/2010 | Sun et al. |
| 8,278,149 | B2 | 10/2012 | Grey |
| 8,358,017 | B2 | 1/2013 | Tsui |

(Continued)

OTHER PUBLICATIONS

Romig, Matt, et al., "3D packaging advancements drive performance, power and density in power devices", Texas Instruments White Paper, (2011), 9 pgs.

*Primary Examiner* — Long Pham
(74) *Attorney, Agent, or Firm* — Schwegman Lundberg & Woessner, P.A.

(57) ABSTRACT

A packaging technology in which power switching elements, such as field-effect transistors (FETs), can be oriented in a vertical position relative to the printed circuit board (PCB) on which the product is mounted. The power die including the switching element(s) can essentially stand "on end" so that they take up very little PCB area. Multiple dies can be positioned this way, and the dies can be attached to a heat sink structure, which is designed to take the heat generated by the dies onto the top of the package. The heat sink structure can be attached to a structure to route the power and analog signals properly to the desired pins/leads/balls of the finished product. Using these techniques can result in a significant increase in the power density (both PCB space and solution volume) of power switching elements, e.g., FETs.

20 Claims, 22 Drawing Sheets

(56) References Cited

U.S. PATENT DOCUMENTS

| | | |
|---|---|---|
| 8,546,937 B2 | 10/2013 | Machida et al. |
| 8,618,654 B2 * | 12/2013 | Sutardja ............... H01L 25/50 |
| | | 257/725 |
| 8,810,013 B2 | 8/2014 | Yang et al. |
| 8,981,559 B2 | 3/2015 | Hsu et al. |
| 9,105,560 B2 | 8/2015 | Roberts et al. |
| 9,721,925 B2 | 8/2017 | Bathan et al. |
| 9,881,853 B2 | 1/2018 | Ahlers et al. |
| 10,242,969 B2 | 3/2019 | Hohlfeld et al. |
| 2012/0228696 A1 | 9/2012 | Carpenter et al. |
| 2013/0105956 A1 | 5/2013 | Jo et al. |
| 2014/0239472 A1 | 8/2014 | Jones et al. |
| 2015/0001618 A1 | 1/2015 | Hebert |
| 2015/0221622 A1 | 8/2015 | Lopez et al. |
| 2016/0172283 A1 | 6/2016 | Cho |
| 2016/0172284 A1 | 6/2016 | Cho |
| 2018/0040540 A1 | 2/2018 | Kasuya et al. |
| 2018/0108598 A1 | 4/2018 | Niu et al. |
| 2019/0043836 A1 | 2/2019 | Fastow et al. |

* cited by examiner

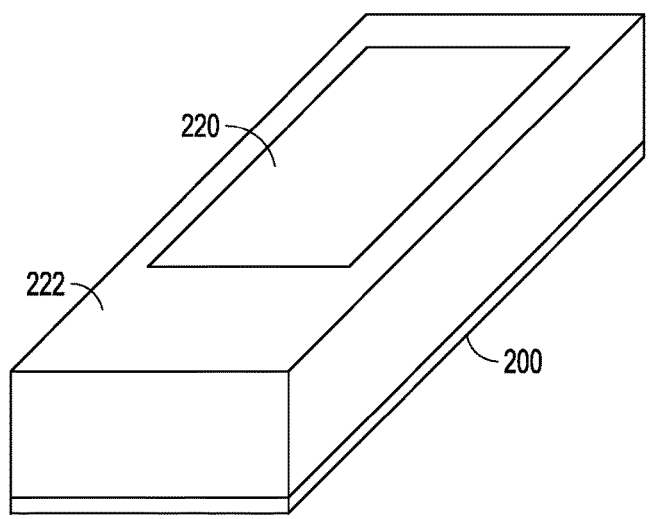
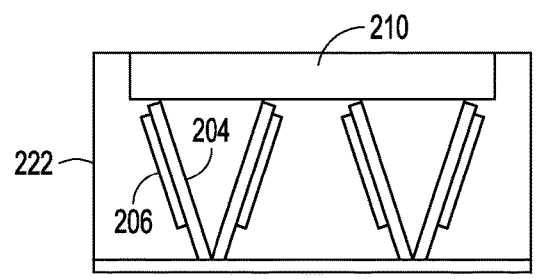
FIG. 17A  FIG. 17B
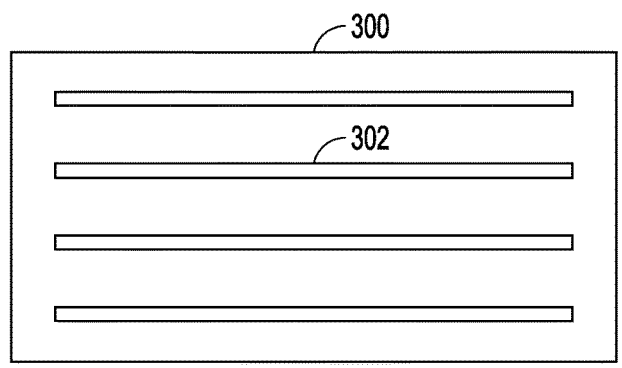
FIG. 18

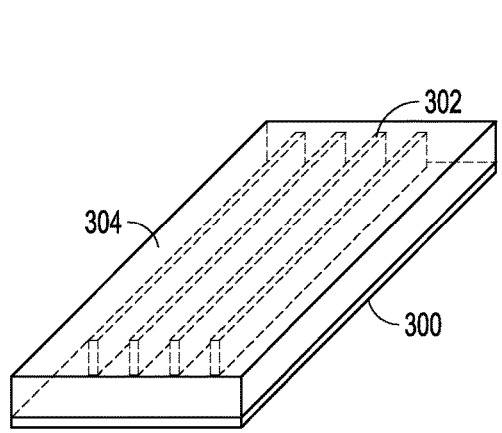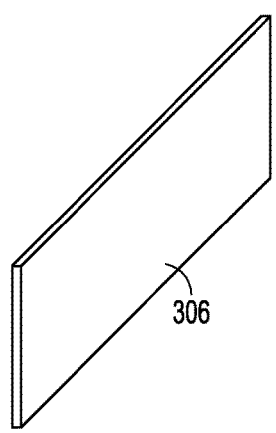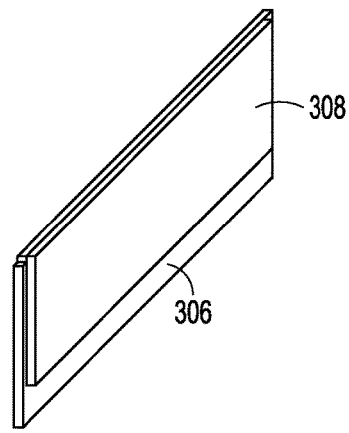
FIG. 19  FIG. 20  FIG. 21
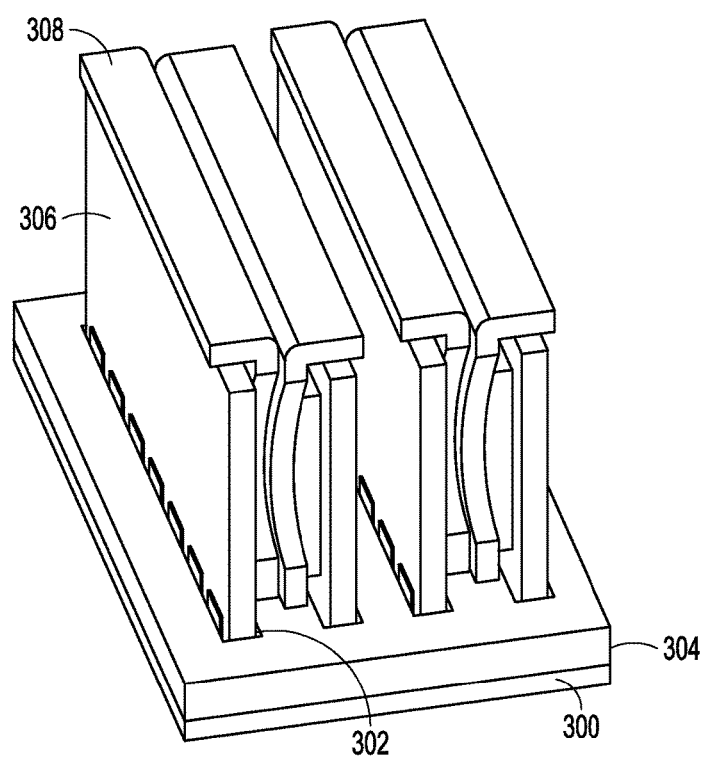
FIG. 22

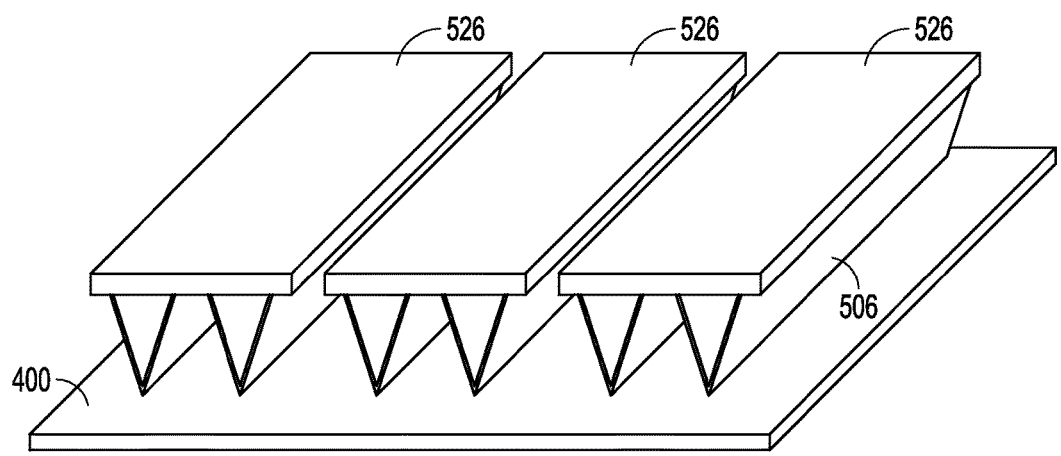
FIG. 31
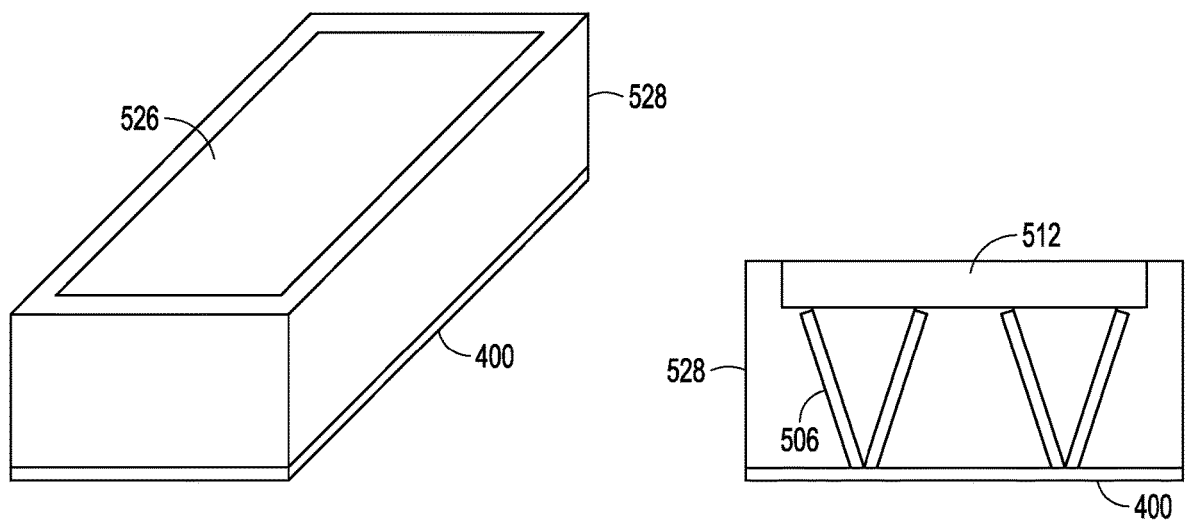
FIG. 32A
FIG. 32B

THREE-DIMENSIONAL PACKAGING TECHNIQUES FOR POWER FET DENSITY IMPROVEMENT

CLAIM OF PRIORITY

This application claims the benefit of priority of U.S. Provisional Patent Application Ser. No. 62/823,242, titled "THREE-DIMENSIONAL PACKAGING TECHNOLOGY FOR POWER FET DENSITY IMPROVEMENT" to Albert M. Wu, et al. and filed on Mar. 25, 2019, the entire contents of which being incorporated herein by reference.

FIELD OF THE DISCLOSURE

This document pertains generally, but not by way of limitation, to electronic packaging assemblies and methods.

BACKGROUND

One of the most common challenges in designing electronic devices is the generation and maintenance of a regulated voltage from another voltage source. Typically, a voltage regulator is used for this purpose. A voltage regulator may be designed as a linear regulator or a switching regulator.

A linear regulator provides closed loop control to regulate the voltage at the load. This type of regulator may be used to provide a constant output voltage that has a lower magnitude than the input voltage source.

In contrast, a switching regulator uses an energy-storage element, such as an inductor, to transfer energy from the input power source to the load in discrete bursts. Feedback circuitry may be used to regulate the energy transfer to maintain a constant voltage at the load. Because the switching regulator operates to transfer energy in discrete bursts, it can be configured to step-up or step-down the voltage of the input voltage source. Moreover, switching regulators are generally more efficient than linear regulators.

Various types of switching regulators are commonly used today in portable electronic devices. A buck converter is an inductor-based regulator used to step-down or buck the input voltage source. A boost converter is an inductor-based regulator used to step-up or boost the input voltage source. In some applications, a buck-boost converter may be used to provide a regulated output that is higher, lower or the same as the input voltage source.

SUMMARY OF THE DISCLOSURE

This disclosure describes, among other things, a packaging technology in which power switching elements, such as field-effect transistors (FETs), can be oriented in a vertical position relative to the printed circuit board (PCB) on which the product is mounted. The power die including the switching element(s) can essentially stand "on end" so that they take up very little PCB area. Multiple dies can be positioned this way, and the dies can be attached to a heat sink structure, which is designed to take the heat generated by the dies onto the top of the package. The heat sink structure can be attached to a structure to route the power and analog signals properly to the desired pins/leads/balls of the finished product. Using these techniques can result in a significant increase in the power density (both PCB space and solution volume) of power switching elements, e.g., FETs.

In some aspects, this disclosure is directed to an electronic package comprising a base fabrication; a first fabrication coupled to a first die; and a substrate including a first surface, wherein the first fabrication is coupled to the first surface of the substrate, wherein the first fabrication is electrically coupled to the base fabrication, and wherein the first fabrication extends away from the base fabrication such that the first die is oriented in a vertical position relative to the base fabrication.

In some aspects, this disclosure is directed to a method of forming an electronic package, the method comprising: coupling a first fabrication to a first surface of a substrate, wherein the first fabrication is coupled to a die; and electrically coupling the first fabrication to a base fabrication, wherein the first fabrication extends away from the base fabrication such that the first die is oriented in a vertical position relative to the base fabrication.

In some aspects, this disclosure is directed to an electronic package comprising: a base fabrication; a first fabrication coupled to a first switching element die; a second fabrication coupled to a second switching element die; and one or more substrates having one or more surfaces, wherein the first fabrication is coupled to a first one of the surfaces and the second fabrication is coupled to a second one of the surfaces, wherein the first and second fabrications are electrically coupled to the base fabrication, and wherein the first and second fabrications extend away from the base fabrication such that their corresponding dies are oriented in a vertical position relative to the base fabrication.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 17A is a perspective view of a conceptual drawing illustrating an example of one of the high-power density DrMOS assemblies of FIG. 16 after separation.

FIG. 17B is a cross-sectional view of the conceptual diagram of FIG. 17A.

FIG. 18 is a conceptual drawing illustrating an example of base fabrication.

FIG. 19 is a perspective view of a conceptual drawing illustrating an example of the molded base fabrication shown in FIG. 18 and more clearly depicting the mold.

FIG. 20 is a conceptual drawing illustrating an example of a daughter fabrication with an embedded bottom-FET die (not depicted), or daughter switch assembly.

FIG. 21 is a conceptual drawing illustrating an example of the daughter switch assembly of FIG. 20 with a heat sink clip that can be soldered or otherwise coupled to the daughter fabrication.

FIG. 22 is a conceptual drawing illustrating an example of multiple daughter switch assemblies of both types (control plus top-FET and bottom-FET) combined into the slots of a molded base fabrication.

FIG. 31 is a conceptual drawing illustrating an example of the top assembly of FIG. 30 coupled to the base fabrication of FIG. 23.

FIG. 32A is a conceptual drawing illustrating an example of the assembly of FIG. 31 molded and separated as a finished high-power density DrMOS assembly.

FIG. 32B is a cross-sectional view of the conceptual diagram of FIG. 32A.

DETAILED DESCRIPTION

In a given printed circuit board (PCB) footprint area, the market is demanding more and more current processing per unit area. This is a natural result of modern day CPUs, GPUs, FPGAs, etc. requiring ever larger levels of current.

To improve efficiency in the power stage of a circuit, the driver and field-effect transistors (FETs), e.g., MOSFET, of a switching regulator, e.g., a buck converter, have been combined into a power module referred to as a "DrMOS" (Driver and MOSFET). To date, DrMOS products have been limited to at most a one-to-one ratio of power field-effect transistor (FET) area to package area. Some parts use FET die and copper clip technology to route power from the PCB to the FET to the backside of the FET to the clip and back down to the PCB.

This disclosure describes various techniques to turn the power die on edge inside the package. Using the techniques of this disclosure, multiple dies can fit in the area on the PCB where only one die used to reside. These dies can be attached to a heat sink structure that brings the heat to the top of the package. As a result, the ratio of power die area to package area can now be much larger than the one-to-one ratio of alternative approaches.

Figure 1:
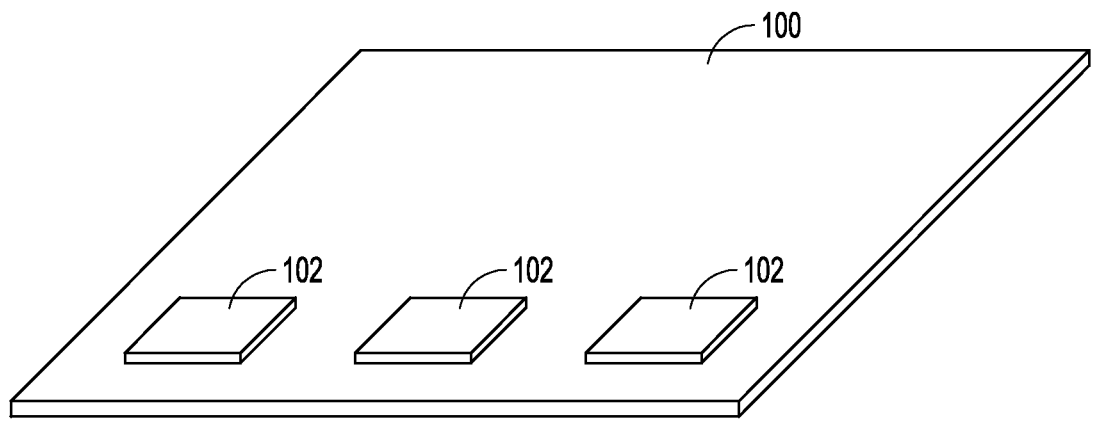
FIG. 1 is a conceptual drawing illustrating an example of a base fabrication.

FIG. 1 is a conceptual drawing illustrating an example of a base fabrication. In some examples, the base fabrication 100, conceptually similar to a PCB, can include four metal layers. In the example shown, multiple control and switching element dies 102 (also referred to as "top-FET dies" 102, where the FET is a switching element), e.g., with copper pillar, can be mounted to the base fabrication 100. Fabrications in this disclosure can include laminates, copper lead frame, molded interconnect substrates (MIS) with epoxy resin as a substrate, only other materials to which a die can connect.

Figure 2:
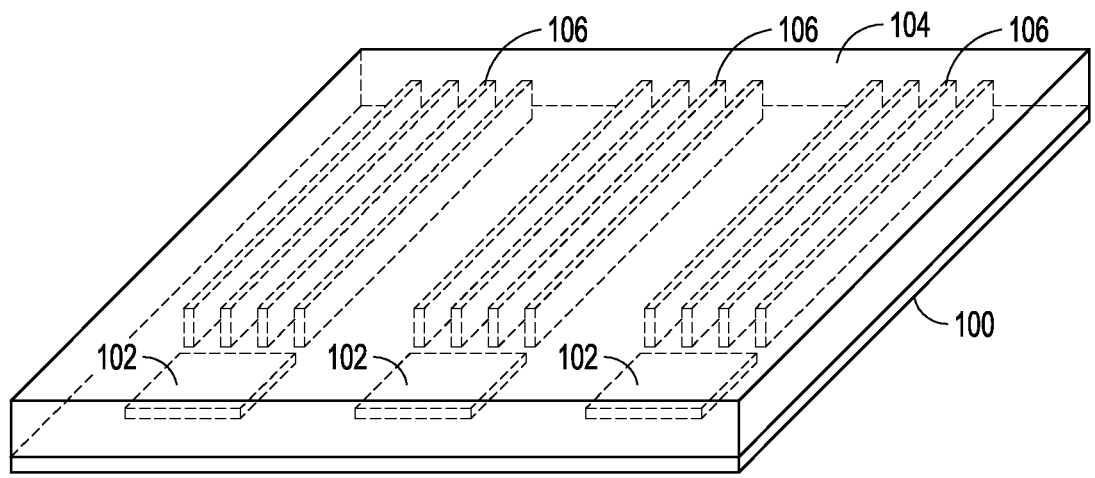
FIG. 2 is a conceptual drawing illustrating an example of a base build construction.

FIG. 2 is a conceptual drawing illustrating an example of a base build construction. The base fabrication 100 of FIG. 1 can be molded such as by covering with a material 104 such as plastic. Then, multiple slots or vias 106 can be formed, e.g., laser drilled, along the length of the plastic mold 104 and down to the base fabrication 100.

Figure 3:
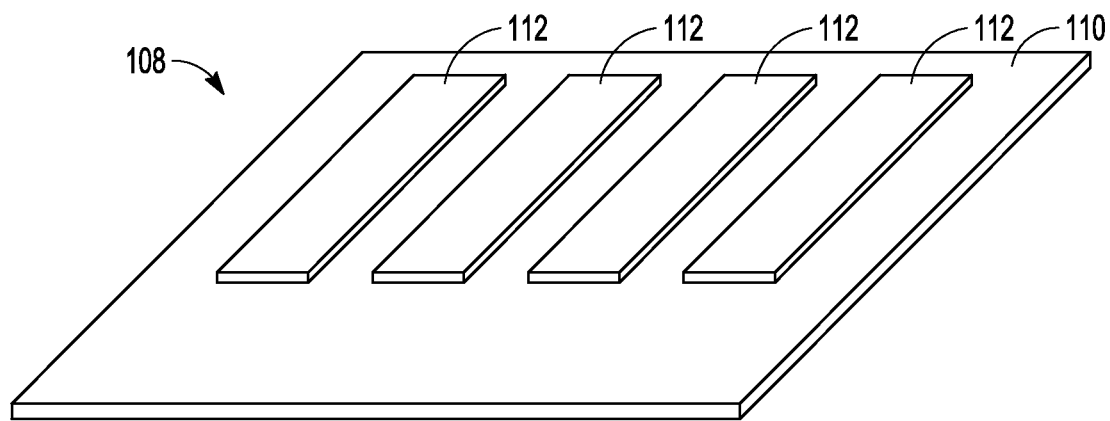
FIG. 3 is a conceptual drawing illustrating an example of a top assembly construction.

FIG. 3 is a conceptual drawing illustrating an example of a top assembly construction. The top assembly 108 includes another fabrication 110 (or "daughter" fabrication), which is different from the base fabrication 100 of FIG. 1. Multiple switching element dies 112 (also referred to as "bottom-FET dies" 112) can be mounted to the daughter fabrication 110 to form a "daughter switch assembly". In some example configurations, the daughter fabrication 110 can include two metal layers. The bottom-FET dies 112, e.g., of a buck converter, can generally be larger than the top-FET dies of the buck converter. The bottom-FET dies 112 can be copper pillar flip chips in which copper pillars are grown on the pads of the bottom-FET wafers and the dies are mounted copper pillar side down on the fabrication. It should be noted that, for simplicity, the metal traces on the fabrications of this disclosure are not shown.

Figure 4:
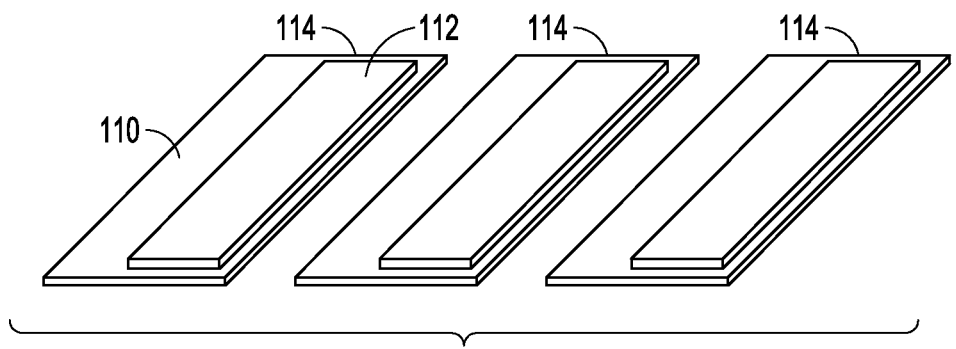
FIG. 4 is a conceptual drawing illustrating an example of the top assembly construction of FIG. 3 after separating the daughter fabrication and bottom-FET die combinations into separate top assemblies.

FIG. 4 is a conceptual drawing illustrating an example of the top assembly construction of FIG. 3 after separating the daughter fabrication and bottom-FET die combinations into separate top assemblies 114. Although not depicted, the left-hand side of each of the daughter fabrications 110 shown in FIG. 4 can include metal contacts that can be soldered to the base fabrication 100 of FIG. 2.

Figure 5:
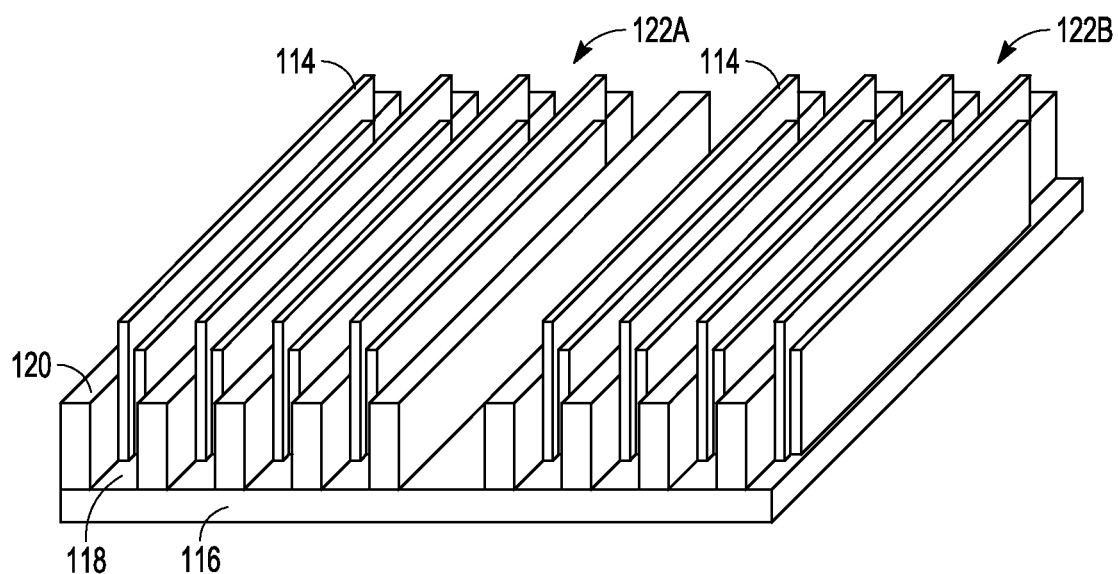
FIG. 5 is a conceptual drawing illustrating an example of the top assemblies of FIG. 4 mounted to a three-dimensional substrate.

FIG. 5 is a conceptual drawing illustrating an example of the top assemblies 114 of FIG. 4 mounted to a three-dimensional substrate 116, e.g., aluminum or copper. As seen in FIG. 5, the substrate can include a plurality of slots 118 defined by vertically extending portions 120 that extend away from the substrate 116, with the top daughter switch assemblies 114 of FIG. 4 positioned within corresponding slots 118.

An assembly 114 (of FIG. 4) that includes a daughter fabrication 110 and at least one die 112, is referred to in this disclosure as a "daughter switch assembly". An epoxy (not depicted), for example, can be used to secure the daughter switch assemblies 114 in place. In addition to acting as a holder to hold the daughter switch assemblies 114 in place in a vertical configuration relative to a base fabrication, the metal substrate 116 can act as a heat sink to dissipate heat generated by the power FETs. In some example configurations, the heat sink or substrate can dissipate enough heat to allow very high levels of current per DrMOS assembly, continuous operation.

Although this disclosure refers specifically to FETs, the techniques of this disclosure are applicable to switching elements generally, such as FETs, bipolar junction transistors (BJT), and silicon carbide (SiC) and gallium nitride (GaN) switching elements.

It should be noted that in the example shown in FIG. 5, there are four daughter switch assemblies 114 per unit. As such, FIG. 5 depicts two units 122A, 122B, before separation. However, during manufacturing, there can be many more daughter switch assemblies 114 positioned longitudinally and extending lengthwise into the page where FIG. 5 depicts a portion of a larger set.

Figure 6:
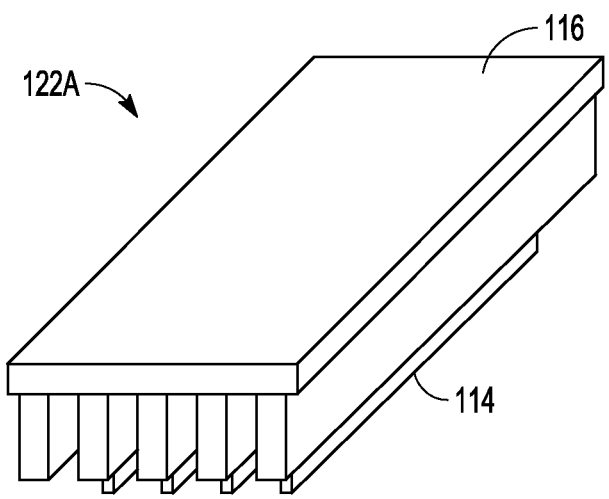
FIG. 6 is a conceptual drawing illustrating an example of one of the top assemblies of FIG. 5 after separation.

FIG. 6 is a conceptual drawing illustrating an example of one of the top assemblies 122 of FIG. 5 after separation. Although not depicted, the bottom of each of the daughter switch assemblies 114 shown in FIG. 6 can include metal contacts that can be soldered to the base fabrication of FIG. 2. The holder 116 in FIG. 6 positions the daughter switch assemblies vertically relative to the base fabrication 100 (of FIG. 1)(and eventually the PCB) and acts as a heat sink to dissipate heat generated by the power FETs.

Figure 7:
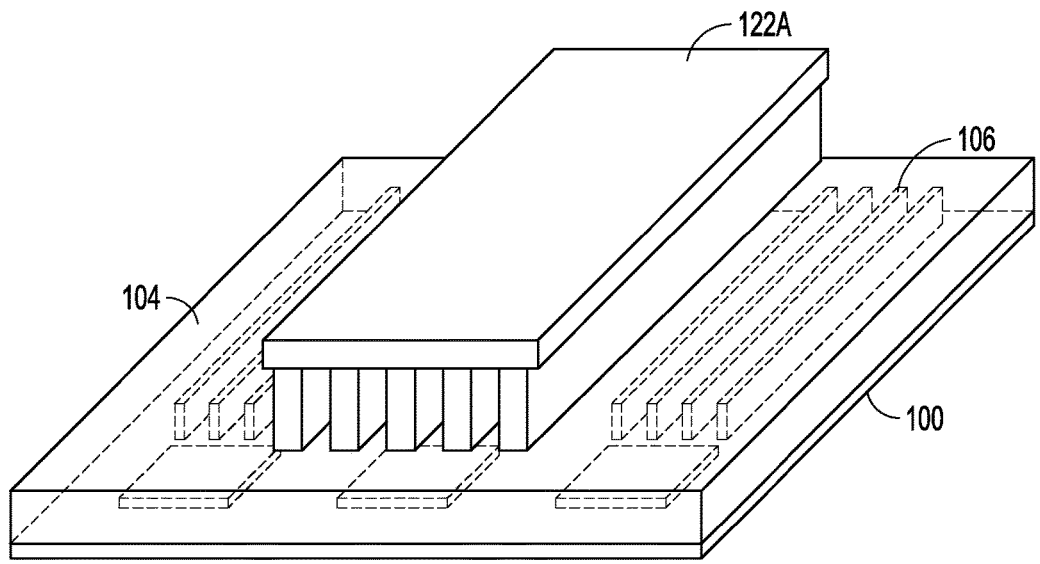
FIG. 7 is a conceptual drawing illustrating an example of the top assembly of FIG. 6 coupled to a corresponding control and top-FET die configuration of the base build construction of FIG. 2.

FIG. 7 is a conceptual drawing illustrating an example of the top assembly 122A of FIG. 6 coupled to a corresponding control and top-FET die configuration of the base build construction of FIG. 2. For example, solder can be applied to the base build construction using the slots 106 cut through the mold 104. Then, the daughter fabrications of the top assembly 122A of FIG. 6 can be inserted into corresponding slots on the base build construction and the drain, source, and gate connections can be made. Throughout this disclosure, the top-FET and bottom-FET dies together form a power circuit. Additional top assemblies, e.g., top assembly 122B of FIG. 5, can be similarly coupled to the base construction and then the top assemblies can be soldered in place. In some examples, the daughter fabrication can also contain the top FET, while the base fabrication can contain the bottom FET and control. Alternatively, the daughter fabrication can contain the top FET and bottom FET together. The control die can be incorporated into the top FET die or bottom FET die or both.

Figures 8A, 8B:
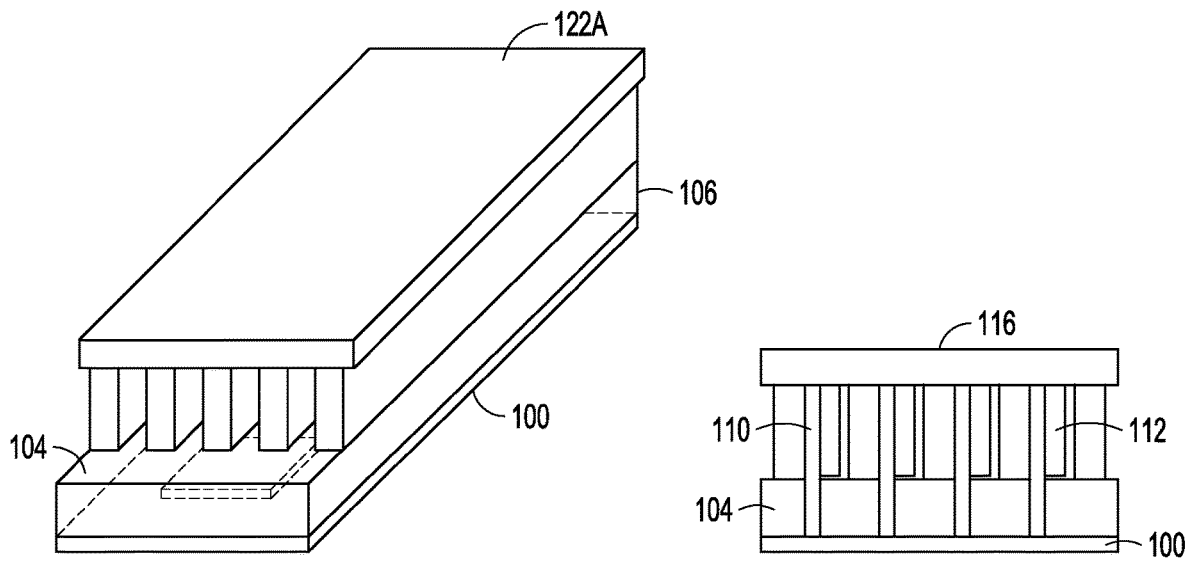
FIG. 8A is a perspective view of a conceptual drawing illustrating an example of one of the high-power density DrMOS assemblies of FIG. 7 after separation.
FIG. 8B is a cross-sectional view of the conceptual diagram of FIG. 8A.

FIG. 8A is a perspective view of a conceptual drawing illustrating an example of one of the high-power density DrMOS assemblies of FIG. 7 after separation. FIG. 8B is a cross-sectional view of the conceptual diagram of FIG. 8A. A customer can then mount a high-power density DrMOS assembly onto a PCB for use in the power stage of a circuit.

Using the techniques of FIGS. 1-8B, at least some of the daughter switch assemblies 114, e.g., the bottom-FETs coupled to corresponding daughter fabrications, can be positioned within an assembly such that they are oriented perpendicularly to a base fabrication on which another FET, e.g., the top-FET, is mounted. In this manner, the bottom-FETs can be oriented in a vertical position relative to the printed circuit board (PCB) on which the product is mounted.

The holder can position the daughter switch assemblies 114 so that they extend away from the base fabrication 100 (and eventually the PCB) at an angle (greater than 0 degrees and less than 180 degrees) relative to the base fabrication. In this manner, the holder can position the daughter switch assemblies 114 such that they extend along a plane that is different from a plane through which the base fabrication 100 extends. As such, the holder can vertically position the die(s) of the daughter switch assemblies 114 relative to the base fabrication 100.

FIGS. 9-17 depict another example of a high-power density DrMOS assembly.

Figure 9:
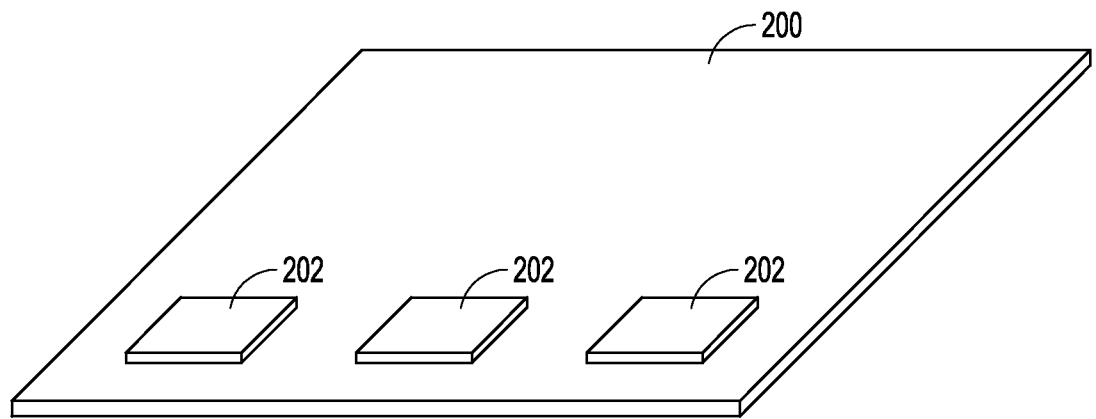
FIG. 9 is a conceptual drawing illustrating an example of a base fabrication.

FIG. 9 is a conceptual drawing illustrating an example of a base fabrication. In some example configurations, the base fabrication 200 can include four metal layers. In the example configuration shown, multiple control plus top-FET dies 202, e.g., with copper pillar, can be mounted to the base fabrication 200.

Figure 10:
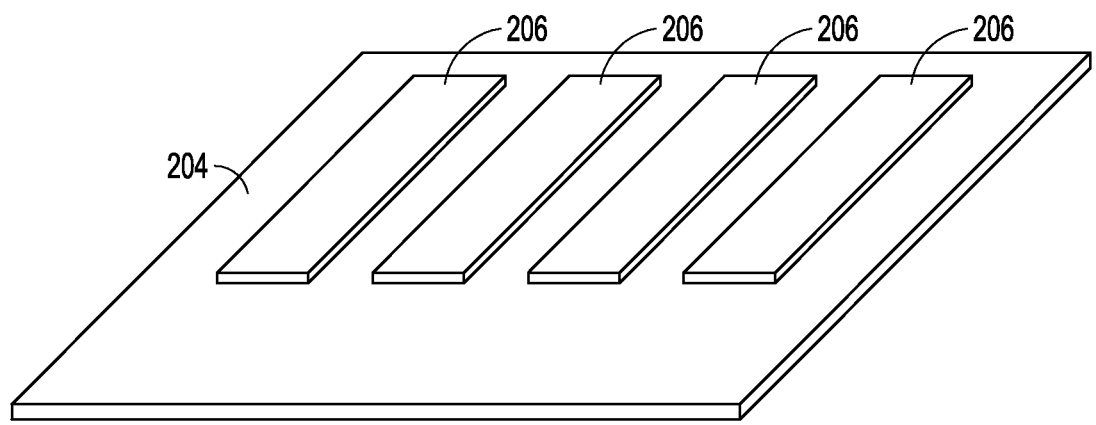
FIG. 10 is a conceptual drawing illustrating an example of a top assembly construction.

FIG. 10 is a conceptual drawing illustrating an example of a top assembly construction. The top assembly can include another fabrication 204 (or "daughter" fabrication), which is different from the base fabrication of FIG. 9. Multiple bottom-FET dies 206 can be mounted to the daughter fabrication 204. In some example configurations, the daughter fabrication 204 can include two metal layers. The bottom-FET dies 206 can be copper pillar flip chips in which copper pillars are grown on the pads of the bottom-FET wafers and the dies are mounted copper pillar side down on the fabrication. It should be noted that, for simplicity, the metal traces on the fabrications of this disclosure are not shown.

Figure 11:
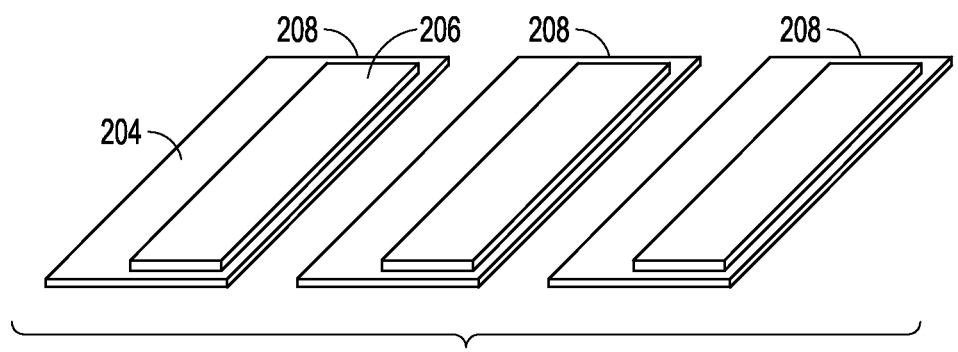
FIG. 11 is a conceptual drawing illustrating an example of the top assembly construction of FIG. 10 after separating the daughter fabrication and bottom-FET die combinations into separate top assemblies.

FIG. 11 is a conceptual drawing illustrating an example of the top assembly construction of FIG. 10 after separating the daughter fabrication and bottom-FET die combinations into separate top assemblies 208. Although not depicted, the left-hand side of each of the daughter fabrications 204 shown in FIG. 11 can include metal contacts that can be soldered to the base fabrication 200 of FIG. 9.

Figure 12:
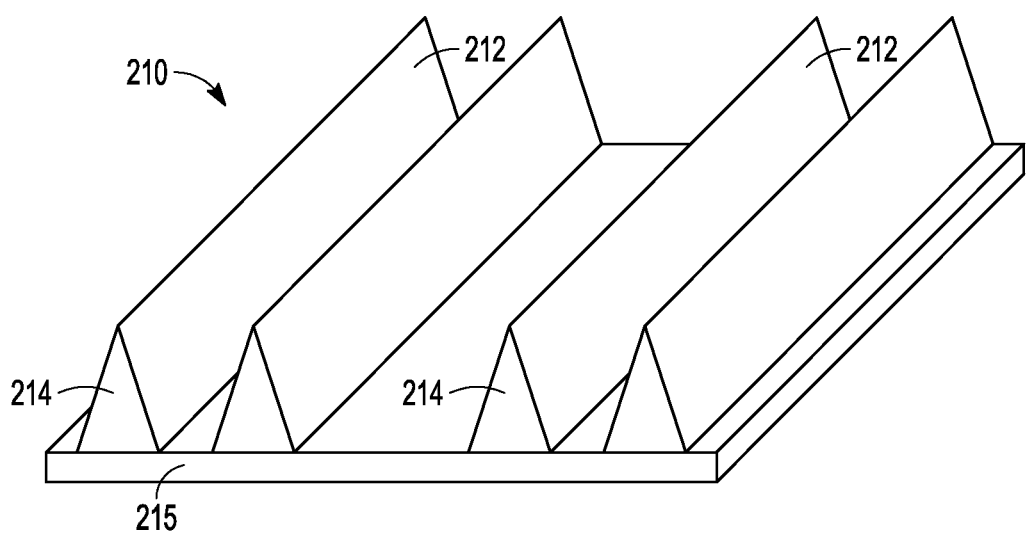
FIG. 12 is a conceptual diagram illustrating another example of a three-dimensional substrate.

FIG. 12 is a conceptual diagram illustrating another example of a three-dimensional metal substrate 210, e.g., aluminum or copper, that can both hold the daughter switch assemblies in place and act as a heat sink. In contrast to the substrate 116 shown in FIG. 5, for example, the substrate 210 in FIG. 12 can include angled surfaces 212, such as at an angle other than 90 degrees. In the specific non-limiting example shown in FIG. 12, the vertically-extending portions 214 formed by the angled surfaces 212 of the substrate 210 can include a generally triangular-shaped cross-section. The vertically-extending portions 214 formed by the angled surfaces 212 extend away from a base 215 of the substrate 210.

Figure 13:
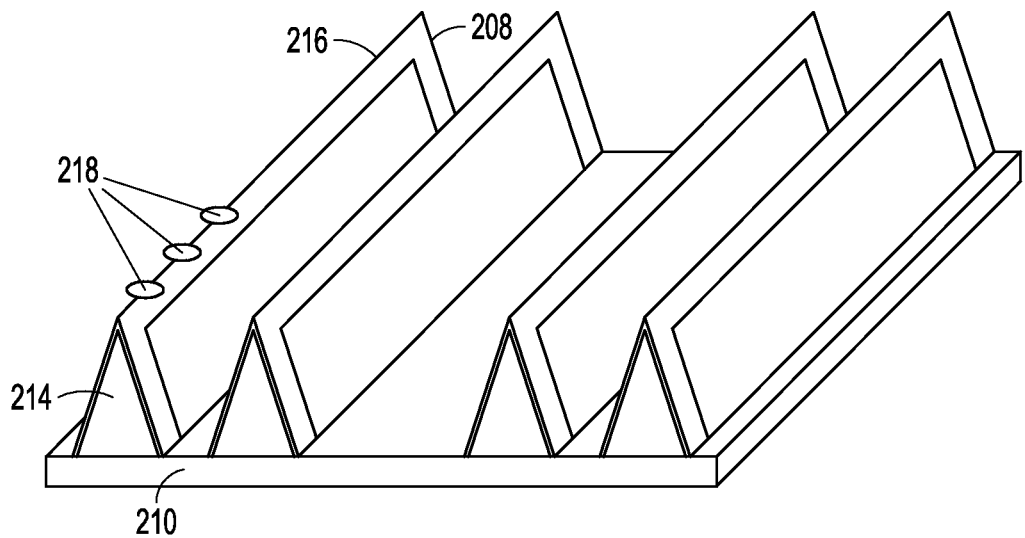
FIG. 13 is a conceptual drawing illustrating an example of the top assemblies of FIG. 11 mounted to the three-dimensional substrate of FIG. 12.

FIG. 13 is a conceptual drawing illustrating an example of the top assemblies 208 of FIG. 11 mounted to the three-dimensional metal substrate of FIG. 12. As seen in FIG. 13, the top assemblies 208 (or daughter switch assemblies 208) of FIG. 11 can be positioned on the angled sides (sides 212 of FIG. 12) of the vertically extending portions 214, rather than using the slots of FIG. 5.

An epoxy, for example, can be used to secure the daughter switch assemblies 208 in place. In addition to acting as a holder to hold the daughter switch assemblies 208 in place in a vertical configuration, the metal substrate 210 can act as a heat sink to dissipate heat generated by the power FETs. In some example configurations, the heat sink can dissipate enough heat to allow very high levels of current per DrMOS assembly, continuous operation.

In the example shown in FIG. 13, by angling the daughter switch assemblies 208, each pair of daughter switch assemblies 208 can come together at a peak 216 thereby allowing their drain, source, and gate terminals to be connected, as shown at 218.

Figure 14:
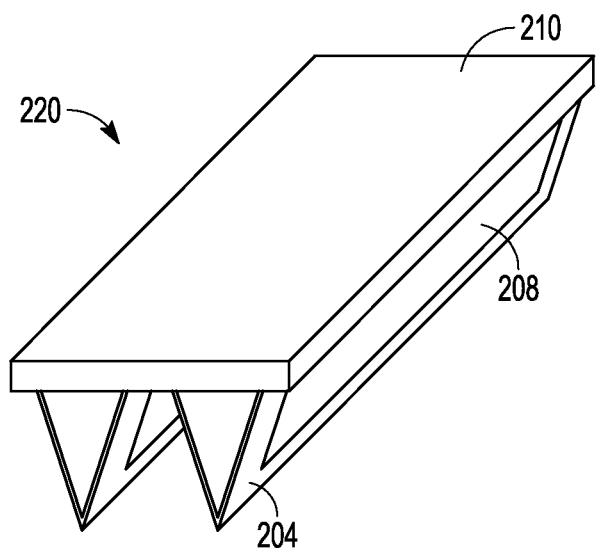
FIG. 14 is a conceptual drawing illustrating an example of one of the top assemblies of FIG. 13 after separation.

FIG. 14 is a conceptual drawing illustrating an example of one of the top assemblies 220 of FIG. 13 after separation. Although not depicted, the bottom of each of the daughter switch assemblies 208 shown in FIG. 14 can include metal contacts that can be soldered to the base fabrication 200 of FIG. 9. The holder can position the daughter switch assemblies 208 so that they extend away from the base fabrication 200 (and eventually the PCB) at an angle (greater than 0 degrees and less than 180 degrees) relative to the base fabrication 200. In this manner, the holder 210 can position the daughter switch assemblies 208 such that they extend along a plane that is different from a plane through which the base fabrication 200 extends. As such, the holder 210 can vertically position the die(s) 206 of the daughter switch assemblies 208 relative to the base fabrication 200. The holder 210 can act as a heat sink to dissipate heat generated by the power FETs.

Figure 15:
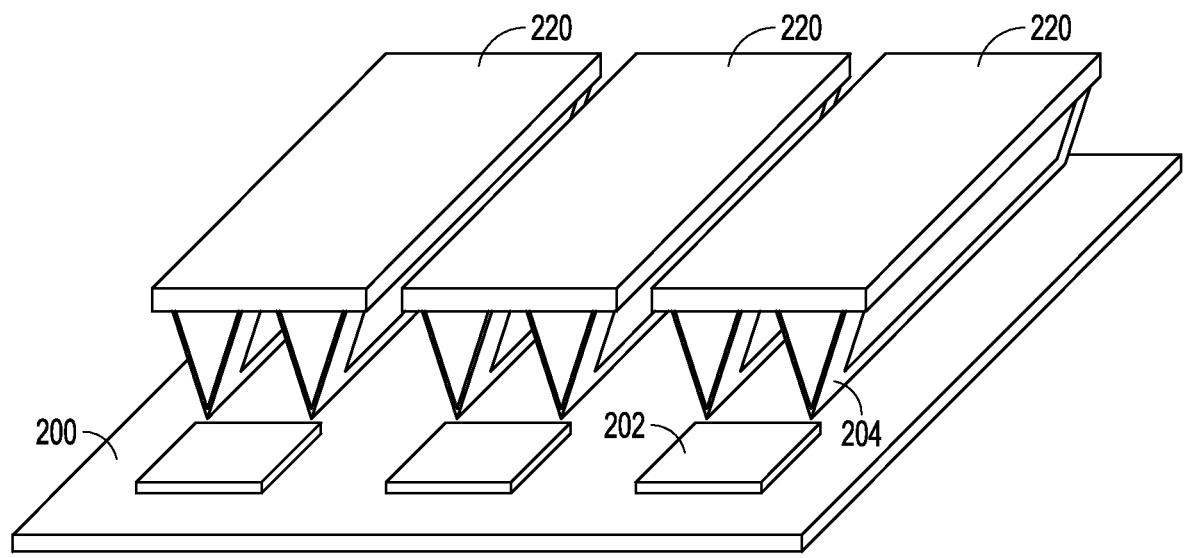
FIG. 15 is a conceptual drawing illustrating an example of the top assembly of FIG. 14 coupled to a corresponding control and top-FET die configuration of the base build construction of FIG. 9.

FIG. 15 is a conceptual drawing illustrating an example of the top assembly of FIG. 14 coupled to a corresponding control and top-FET die configuration of the base build construction of FIG. 9. For example, solder can be applied to the base build construction. Then, the daughter fabrications 204 of the top assembly of FIG. 14 can be coupled to the base build construction and the drain, source, and gate connections can be made. Additional top assemblies can be similarly coupled to the base construction and then the top assemblies can be soldered in place.

Figure 16:
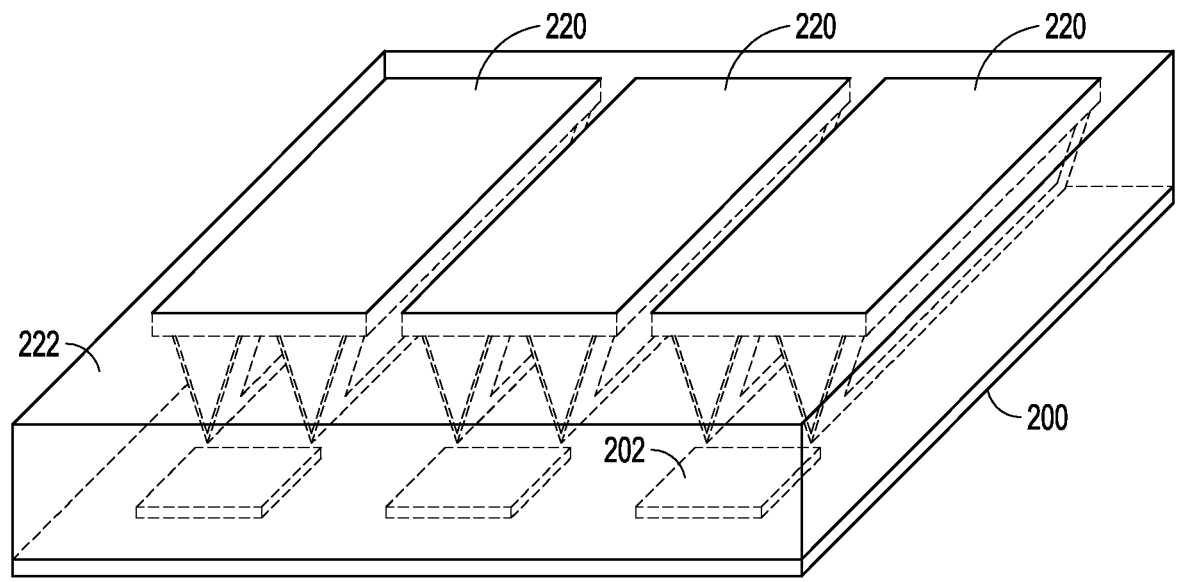
FIG. 16 is a conceptual drawing illustrating an example of the assembly of FIG. 15 molded with a material such as plastic.

FIG. 16 is a conceptual drawing illustrating an example of the assembly of FIG. 15 molded with a material 222 such as plastic. In some examples, molding can be performed using film-assisted mold to leave the top portion of the substrate, which acts as a heat sink, exposed.

FIG. 17A is a perspective view of a conceptual drawing illustrating an example of one of the high-power density DrMOS assemblies of FIG. 16 after separation. FIG. 17B is a cross-sectional view of the conceptual diagram of FIG. 17A. A customer can then mount a high-power density DrMOS assembly onto a PCB for use in the power stage of a circuit. In some examples, the daughter fabrication can also contain the top FET, and the base fabrication can contain the bottom FET and control. Alternatively, the daughter fabrication can contain the top FET and bottom FET together. The control die can be incorporated into the top FET die or bottom FET die or both.

FIGS. 18-22 depict another high-power density DrMOS assembly.

FIG. 18 is a conceptual drawing illustrating an example of base fabrication. FIG. 18 is a top view of a molded base fabrication 300 with multiple slots or vias 302 formed, e.g., laser drilled, along the length of the plastic mold and down to the base fabrication. The non-limiting example configuration shown in FIG. 18 has dimensions of about 5 millimeters (mm) by about 8 mm. In contrast to other base fabrications shown above, e.g., in FIG. 1, where multiple control plus top-FET dies were mounted to the base fabrication, multiple control plus top-FET dies can be built into another type of daughter board assembly and used in conjunction with the bottom FET daughter boards to construct the top assembly (not depicted).

FIG. 19 is a perspective view of a conceptual drawing illustrating an example of the molded base fabrication shown in FIG. 18 and more clearly depicting the mold 304, which can be a material such as plastic.

FIG. 20 is a conceptual drawing illustrating an example of a daughter fabrication 306 with an embedded bottom-FET die (not depicted), or daughter switch assembly 306. The non-limiting example configuration shown in FIG. 20 has dimensions of about 4 mm by about 7 mm.

FIG. 21 is a conceptual drawing illustrating an example of the daughter switch assembly 306 of FIG. 20 with a heat sink clip 308, e.g., aluminum or copper, that can be soldered or otherwise coupled to the daughter fabrication. The heat sink clip 308 is also referred to as a substrate in this disclosure. Coupling the heat sink material directly to the daughter switch assembly 306 can eliminate the need to use a separate heat sink substrate, e.g., one including slots or angled surfaces, such as shown in FIG. 5 or FIG. 12, respectively. Although not depicted, the bottom of the daughter switch assembly 306 shown in FIG. 21 can include metal contacts that can be soldered to the base fabrication 300 of FIG. 19.

FIG. 22 is a conceptual drawing illustrating an example of multiple daughter switch assemblies of both types (control plus top-FET and bottom-FET) combined into the slots of a molded base fabrication. The non-limiting example configuration shown has dimensions of about 5 mm by about 8 mm and a height of about 5 mm. In the particular non-limiting configuration shown, two of the daughter switch assemblies can be joined together to form a subassembly that can then be inserted into the slots formed in the base fabrication. Each daughter switch assembly can be coupled to a corresponding substrate, such as the heat sink clip 308.

It should be noted that in the example configuration shown in FIG. 22, the control and top-FET dies are not embedded in the base fabrication. FIG. 22 depicts both types of daughter switch assemblies where fabrication and die using copper pillar assembly technologies are used. In other implementations, a base fabrication with embedded construction containing control plus top-FET dies can be used, resulting in the daughter board assembly being of only one type.

FIGS. 23-33 depict another example of a high-power density DrMOS assembly.

Figure 23:
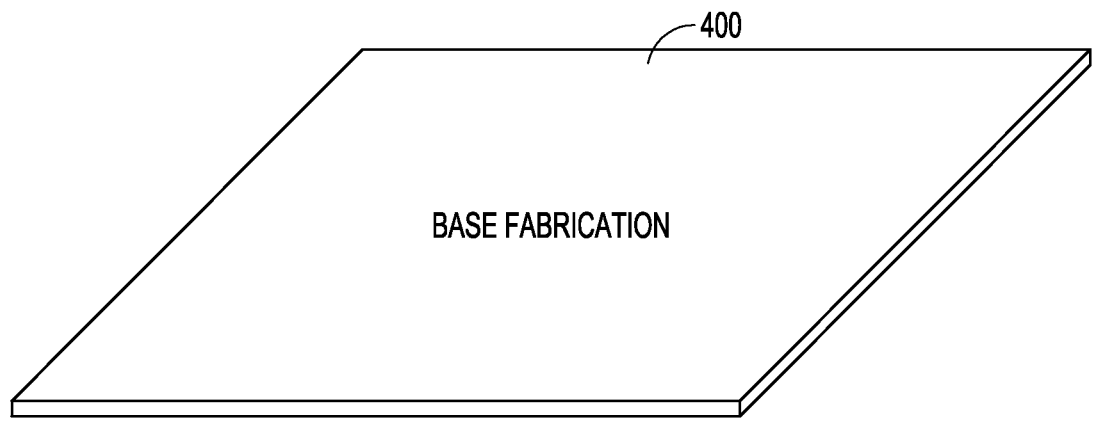
FIG. 23 is a conceptual drawing illustrating an example of a base fabrication.
Figure 25:
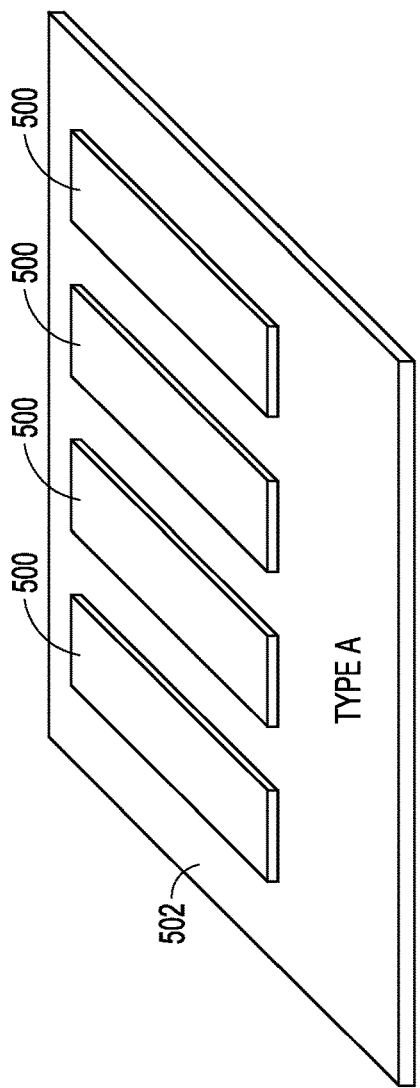
FIG. 25 is a conceptual drawing illustrating an example of a second daughter switch assembly (Type A) construction.

FIG. 23 is a conceptual drawing illustrating an example of a base fabrication. In some example configurations, the base fabrication 400 can include four metal layers. In the example configuration shown, the base fabrication does not include the control and top-FET dies, which can be formed on a daughter fabrication, as shown in FIG. 25. Again, for simplicity, the metal traces on the fabrications of this disclosure are not shown.

Figure 24:
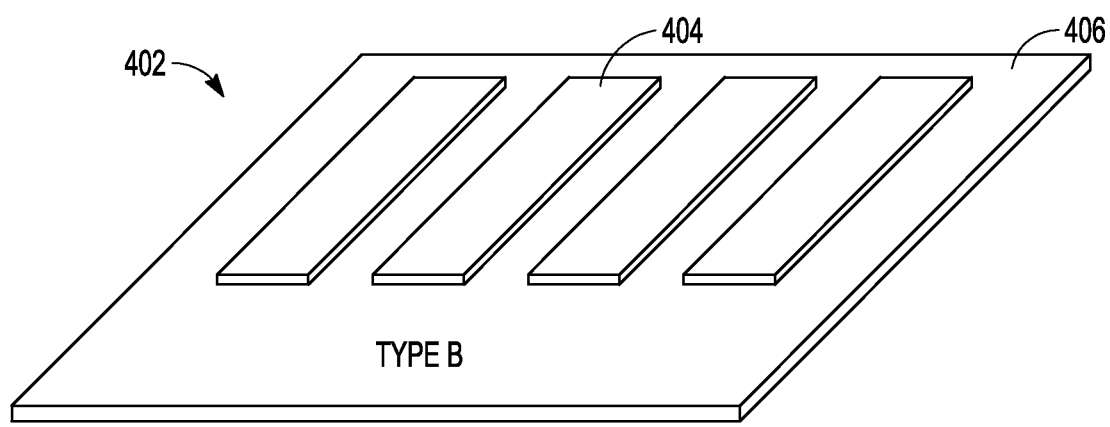
FIG. 24 is a conceptual drawing illustrating an example of a first daughter switch assembly (Type B) construction.

FIG. 24 is a conceptual drawing illustrating an example of a first daughter switch assembly construction. The first daughter switch assembly of FIG. 24, or "Type B" daughter switch assemblies 402, can include multiple bottom-FET dies 404 embedded in daughter fabrication 406. In some example configurations, the Type B daughter fabrications 406 can include four metal layers. Although only four bottom-FET dies 404 are shown, these four bottom-FET dies 404 can be the first ones of four rows (for example) of numerous bottom-FET dies.

FIG. 25 is a conceptual drawing illustrating an example of a second daughter switch assembly construction. The second daughter switch assembly of FIG. 25, or "Type A" daughter switch assemblies, can include multiple embedded control and top-FET dies 500. In some example configurations, the Type A daughter fabrications 502 can include four metal layers. Although only four bottom-FET dies 500 are shown, these four bottom-FET dies 500 can be the first ones of four rows (for example) of numerous bottom-FET dies.

Figure 26:
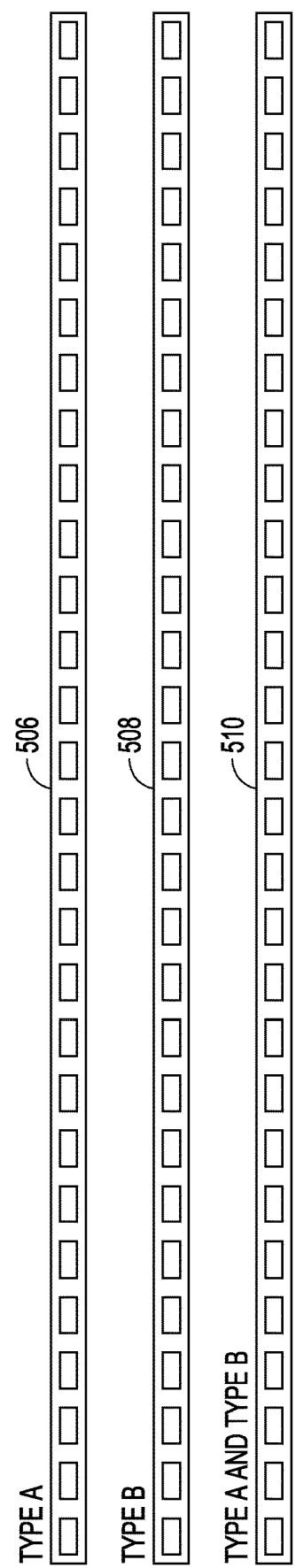
FIG. 26 is a conceptual drawing illustrating an example of strips of Type A and Type B daughter switch assemblies.

FIG. 26 is a conceptual drawing illustrating an example of strips of Type A and Type B daughter switch assemblies. As indicated above, rows of either or both of the Type A and Type B daughter switch assemblies, referred to generally as daughter switch assemblies 504, can be formed on a single fabrication. Once formed, individual strips of either or both of the Type A and Type B daughter switch assemblies can be formed, as shown in FIG. 26. FIG. 26 depicts a row 506 of Type A daughter switch assemblies, a row 508 of Type B daughter switch assemblies, and a row 510 of both Type A and Type B daughter switch assemblies.

Figure 27:
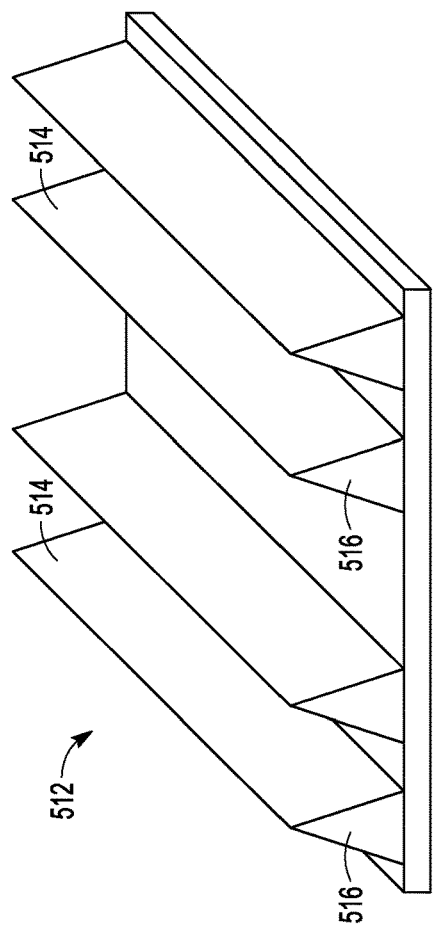
FIG. 27 is a conceptual diagram illustrating another example of a three-dimensional substrate.

FIG. 27 is a conceptual diagram illustrating another example of a three-dimensional metal substrate 512, e.g., aluminum or copper, that can both hold the Type A and Type B daughter switch assemblies 504 in place and act as a heat sink. The substrate shown in FIG. 27 can be similar to the substrate shown in FIG. 12 and can include angled surfaces 514. In the specific non-limiting example shown in FIG. 27, the vertically-extending portions 516 formed by the angled surfaces 514 of the substrate 512 can include a generally triangular-shaped cross-section.

Figure 28:
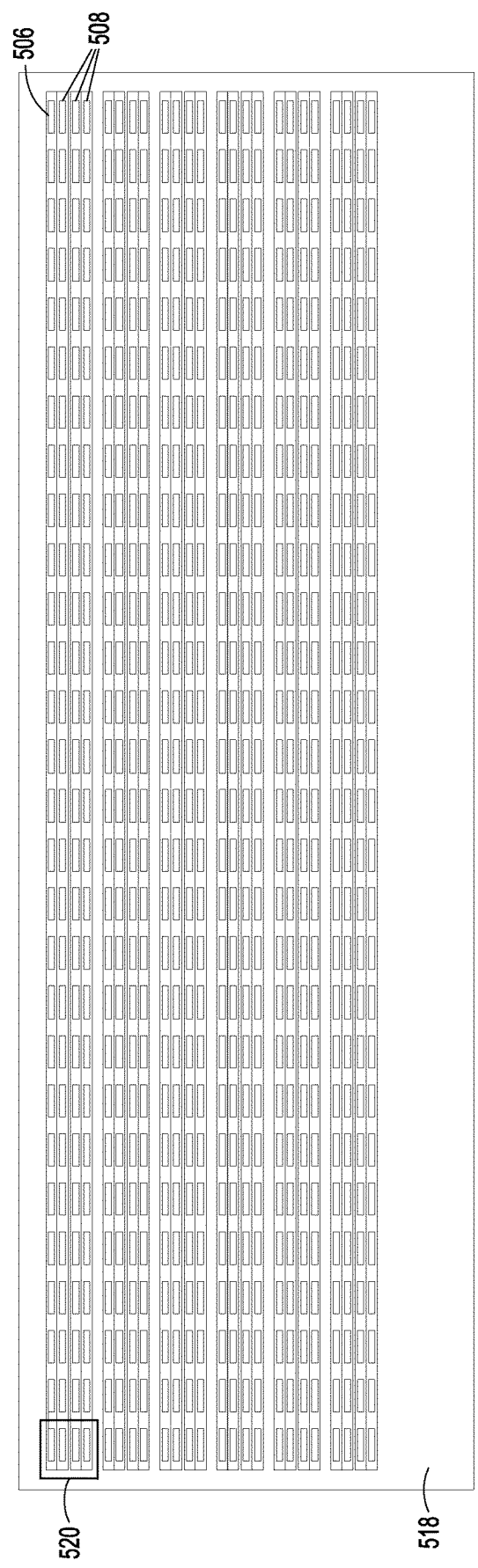
FIG. 28 is a conceptual diagram illustrating an example of a top view of multiple strips of Type A and Type B daughter switch assemblies coupled to a substrate.

FIG. 28 is a conceptual diagram illustrating an example of a top view of multiple strips of Type A and Type B daughter switch assemblies 504, such as shown in FIG. 26, coupled to a substrate 518, such as shown in FIG. 27. A strip of Type A daughter switch assemblies (control and top-FET dies) can be coupled to a first angled side of the substrate and a first strip of Type B daughter switch assemblies (bottom-FET dies) can be coupled to an adjacent second angled side of the substrate 512 of FIG. 27. A second strip of Type B daughter switch assemblies can be coupled to a third angled side of the substrate and a third strip of Type B daughter switch assemblies can be coupled to an adjacent fourth angled side of the substrate 512. In this manner, a pattern of Type A, Type B, Type B, Type B strips of daughter switch assemblies can be formed on the substrate 512. A single unit 520 can include a Type A, Type B, Type B, Type B configuration of daughter switch assemblies, as shown.

Figure 29:
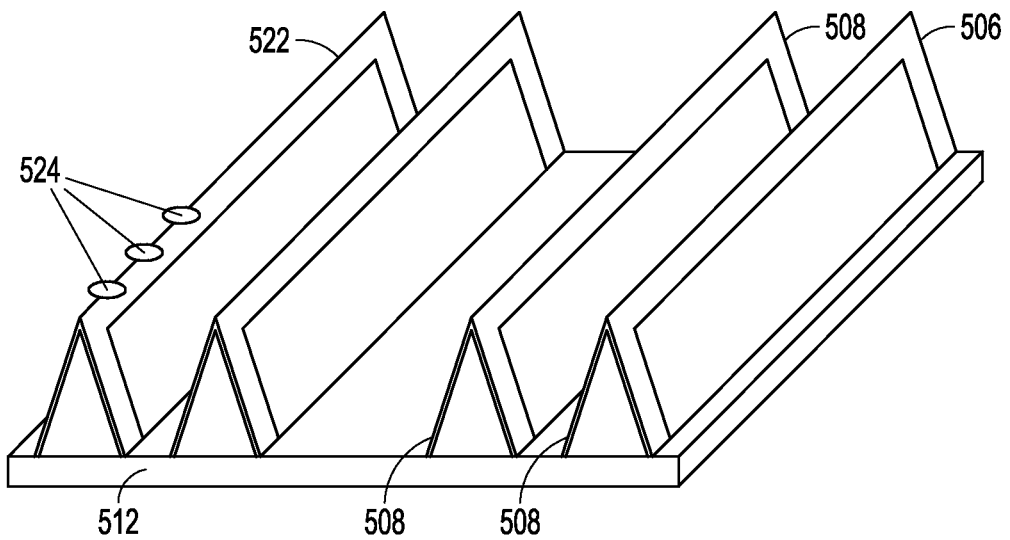
FIG. 29 is a conceptual drawing illustrating an example of Type A, Type B, Type B, Type B configuration of FIG. 28.

FIG. 29 is a conceptual drawing illustrating an example of Type A, Type B, Type B, Type B configuration of FIG. 28. As seen in FIG. 29, the daughter switch assemblies 506 and 508 can be positioned on the angled sides of the vertically extending portions. An epoxy, for example, can be used to secure the daughter switch assemblies in place. In addition to acting as a holder to hold the daughter switch assemblies in place in a vertical position relative to a base fabrication, the metal substrate 512 can act as a heat sink to dissipate heat generated by the power FETs. In some example configurations, the heat sink can dissipate enough heat to allow very high levels of current per DrMOS assembly, continuous operation.

In the example shown in FIG. 29, by angling the daughter switch assemblies, each pair of daughter switch assemblies can come together at a peak 522 thereby allowing their drain, source, and gate terminals 524 to be connected.

Figure 30:
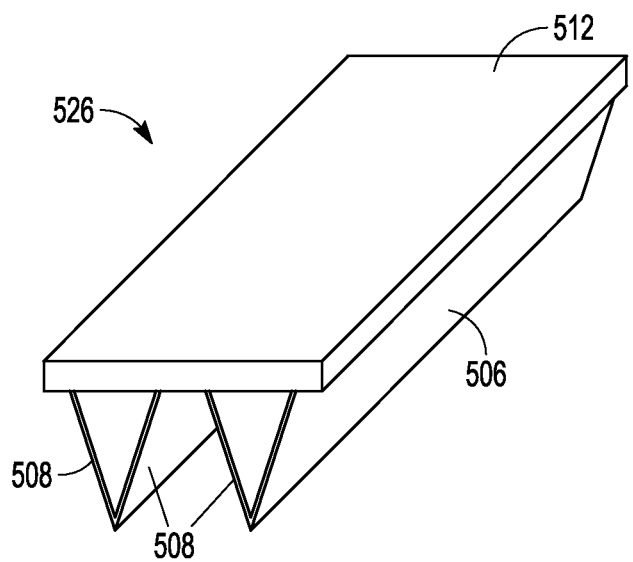
FIG. 30 is a conceptual drawing illustrating an example of a completed top assembly of FIG. 29 after separation.

FIG. 30 is a conceptual drawing illustrating an example of a completed top assembly 526 of FIG. 29 after separation. Although not depicted, the bottom of each of the daughter switch assemblies, e.g., daughter switch assembly 506, shown in FIG. 30 can include metal contacts that can be soldered to the base fabrication 400 of FIG. 23.

The holder 512 can position the daughter switch assemblies, e.g., daughter switch assembly 506, so that they extend away from the base fabrication (and eventually the PCB) at an angle (greater than 0 degrees and less than 180 degrees) relative to the base fabrication 400. In this manner, the holder 512 can position the daughter switch assemblies, e.g., daughter switch assembly 506, such that they extend along a plane that is different from a plane through which the base fabrication, e.g., base fabrication 400 of FIG. 23, extends. As such, the holder 512 can vertically position the die(s) of the daughter switch assemblies relative to the base fabrication.

FIG. 31 is a conceptual drawing illustrating an example of the top assembly 526 of FIG. 30 coupled to the base fabrication 400 of FIG. 23. For example, solder can be applied to the base fabrication 400. Then, the daughter switch assemblies, e.g., daughter switch assembly 506, of the top assembly 526 of FIG. 30 can be coupled to the base fabrication 400 and the drain, source, gate and other connections can be made (note that the drawing excludes the "other" connections, for simplicity). Additional top assemblies 526 can be similarly coupled to the base fabrication and then the top assemblies can be soldered in place.

FIG. 32A is a conceptual drawing illustrating an example of the assembly of FIG. 31 molded and separated as a finished high-power density DrMOS assembly. FIG. 32B is a cross-sectional view of the conceptual diagram of FIG. 32A. In some examples, molding can be performed using film-assisted mold 528 to leave the top portion of the substrate, which acts as a heat sink, without any molding. In some example implementations, molding need not be used. If molding is not used, then air channels exist next to each of the daughter switch assemblies.

Figure 33:
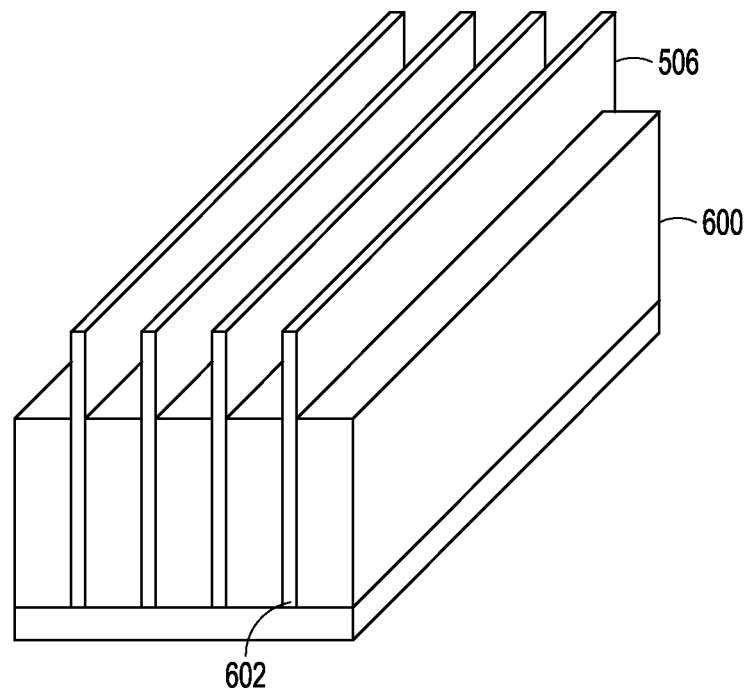
FIG. 33 is a conceptual drawing illustrating an example of an alternative top assembly in combination with a substrate.

FIG. 33 is a conceptual drawing illustrating an example of an alternative top assembly in combination with a substrate. The substrate 600, e.g., aluminum or copper, can include a plurality of slots 602 to hold corresponding daughter switch assemblies 604 and can act as a heat sink. The Type A daughter switch assembly 506 (with embedded control and top-FET dies) can have its own dedicated I/O to the base fabrication.

FIGS. 34-46 depict another example of a high-power density DrMOS assembly.

Figure 34:
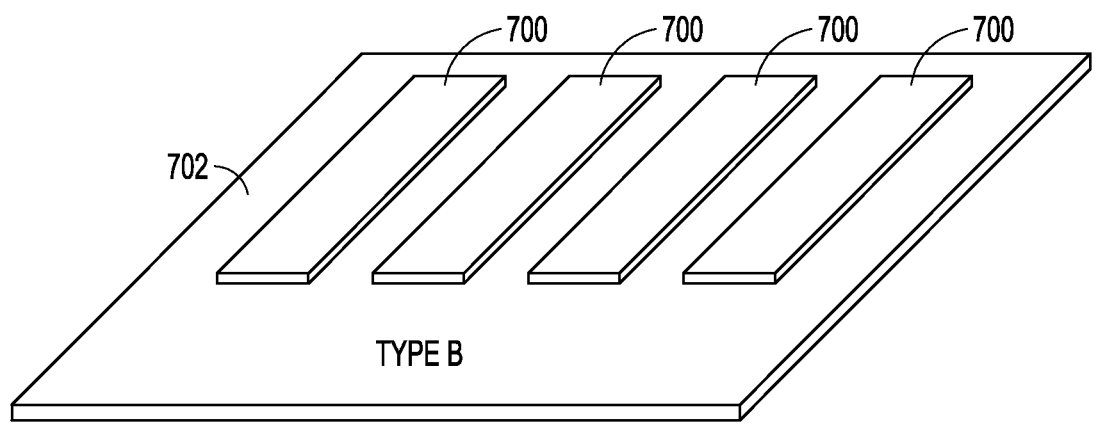
FIG. 34 is a conceptual drawing illustrating an example of a first daughter fabrication (Type B) construction.

FIG. 34 is a conceptual drawing illustrating an example of a first daughter fabrication. The first daughter switch assembly of FIG. 34, or "Type B" daughter switch assemblies, can include multiple embedded bottom-FET dies 700. In some example configurations, the Type B daughter fabrications 702 can include four metal layers. Although only four bottom-FET dies 700 are shown, these four bottom-FET dies 700 can be the first ones of four rows (for example) of numerous bottom-FET dies.

Figure 35:
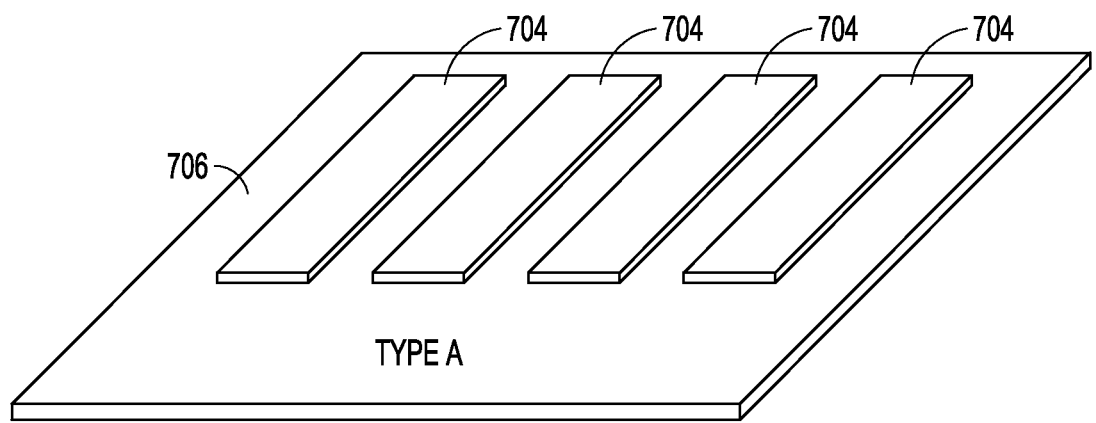
FIG. 35 is a conceptual drawing illustrating an example of a second daughter switch assembly (Type A) construction.

FIG. 35 is a conceptual drawing illustrating an example of a second daughter switch assembly construction. The second daughter switch assembly of FIG. 35, or "Type A" daughter switch assemblies, can include multiple embedded control and top-FET dies 704. In some example configurations, the Type A daughter fabrications 706 can include four metal layers. Although only four control and top-FET dies 704 are shown, these four control and top-FET dies 704 can be the first ones of four rows (for example) of numerous control and top-FET dies.

Figure 36:
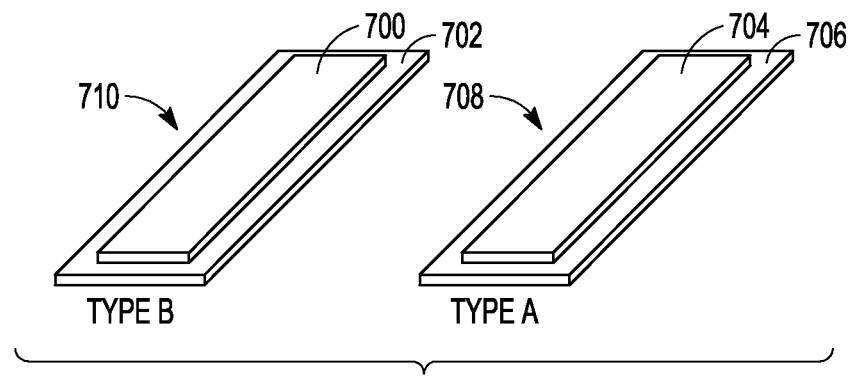
FIG. 36 is a conceptual drawing illustrating an example of individual Type A and Type B daughter switch assemblies after separation.

FIG. 36 is a conceptual drawing illustrating an example of individual Type A and Type B daughter switch assemblies after separation. In some example implementations, the individual Type A and Type B daughter switch assemblies 708, 710 can then be placed into corresponding pockets of a carrier tape and sealed with a cover. The tape can be wound onto a reel, which can be to be loaded onto a pick and place machine for placement during manufacturing.

Figure 37:
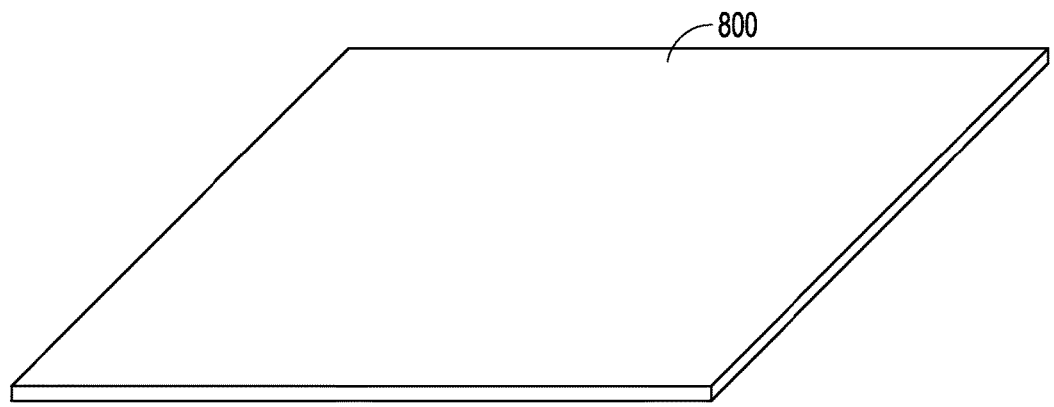
FIG. 37 is a conceptual drawing illustrating an example of a lead frame of a top assembly.

FIG. 37 is a conceptual drawing illustrating an example of a lead frame of a top assembly. The lead frame 800, e.g., a copper lead frame, can be about 1 mm thick, for example.

Figure 38A:
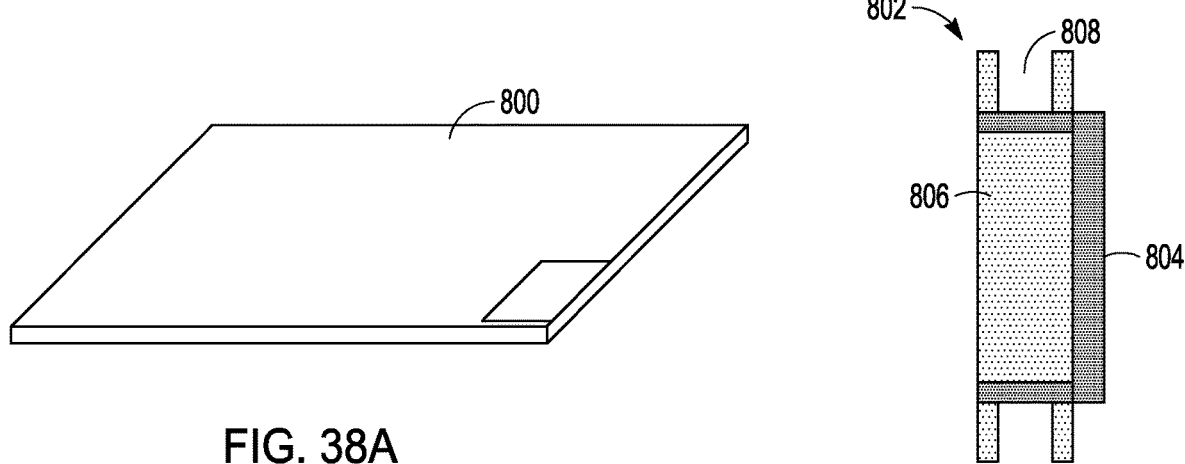
FIGS. 38A and 38B are conceptual drawings illustrating an example of a portion of the lead frame of FIG. 37 after etching.
Figure 38B:
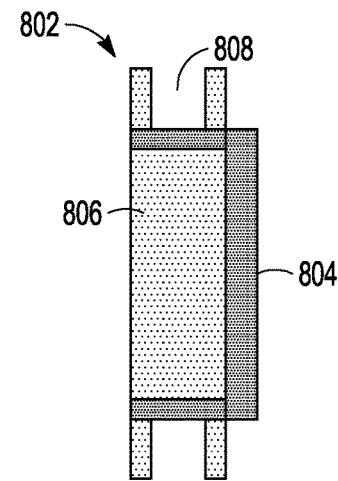

FIGS. 38A and 38B are conceptual drawings illustrating an example of a portion of the lead frame of FIG. 37 after etching. A top view of a generally rectangular single unit 802 is shown in FIG. 38B that depicts three areas: 1) no etch (dark areas), an example of which being shown at 804; 2) half etch (lighter areas), an example of which being shown at 806; and 3) all etch (white areas), an example of which being shown at 808.

Figure 39:
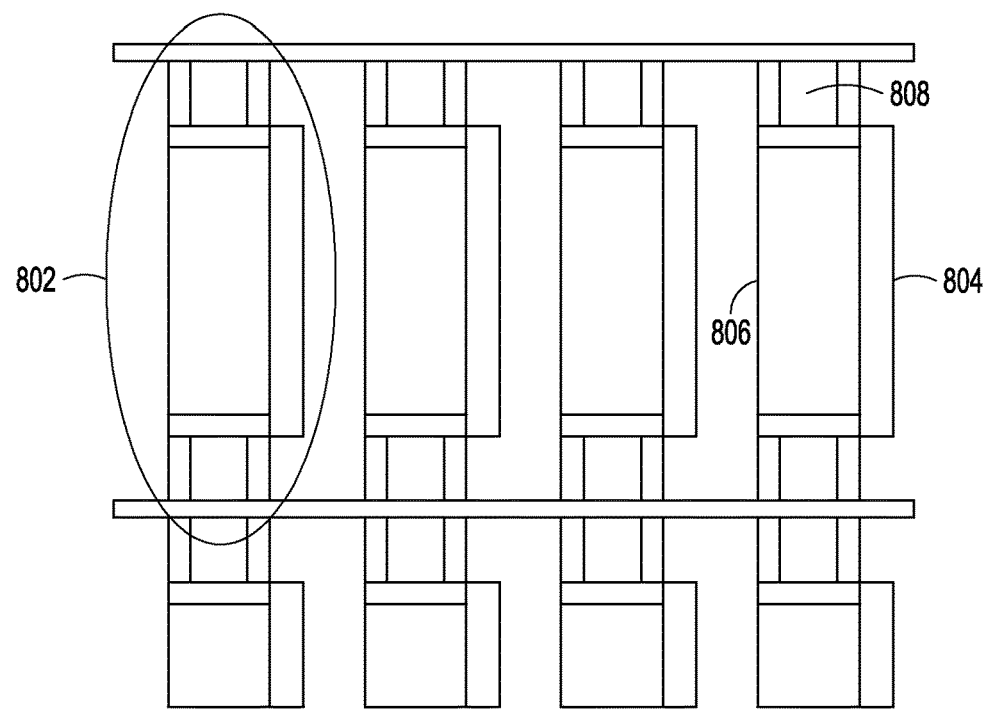
FIG. 39 is a conceptual drawing illustrating an example of a larger portion of the lead frame of FIG. 37 after etching using the pattern of FIG. 38.

FIG. 39 is a conceptual drawing illustrating an example of a larger portion of the lead frame 802 of FIG. 37 after etching using the pattern of FIG. 38. Epoxy can be applied into the half etch regions positioned between the no etch regions to secure Type B daughter switch assemblies, as shown in FIG. 40.

Figure 40:
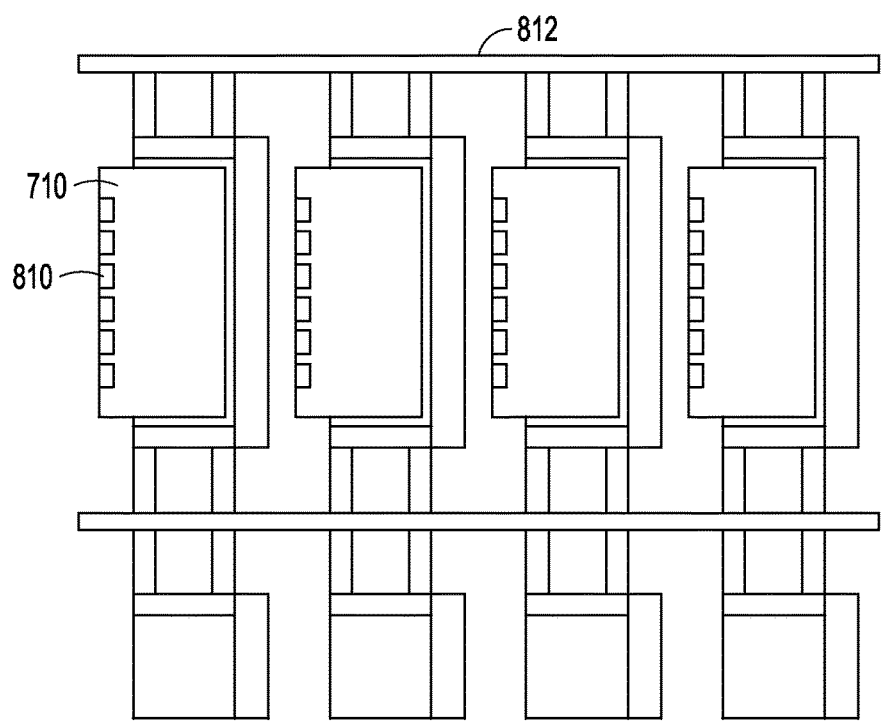
FIG. 40 is a conceptual drawing illustrating an example of the lead frame portion of FIG. 39 after coupling with the Type B daughter switch assemblies of FIG. 36 to form a lead frame assembly.

FIG. 40 is a conceptual drawing illustrating an example of the lead frame portion of FIG. 39 after coupling with the Type B daughter switch assemblies 710 of FIG. 36 to form a lead frame assembly 812. The bottom of each of the daughter switch assemblies 710 shown in FIG. 40 can include metal contacts 810 that can be soldered to the base fabrication.

Figure 41:
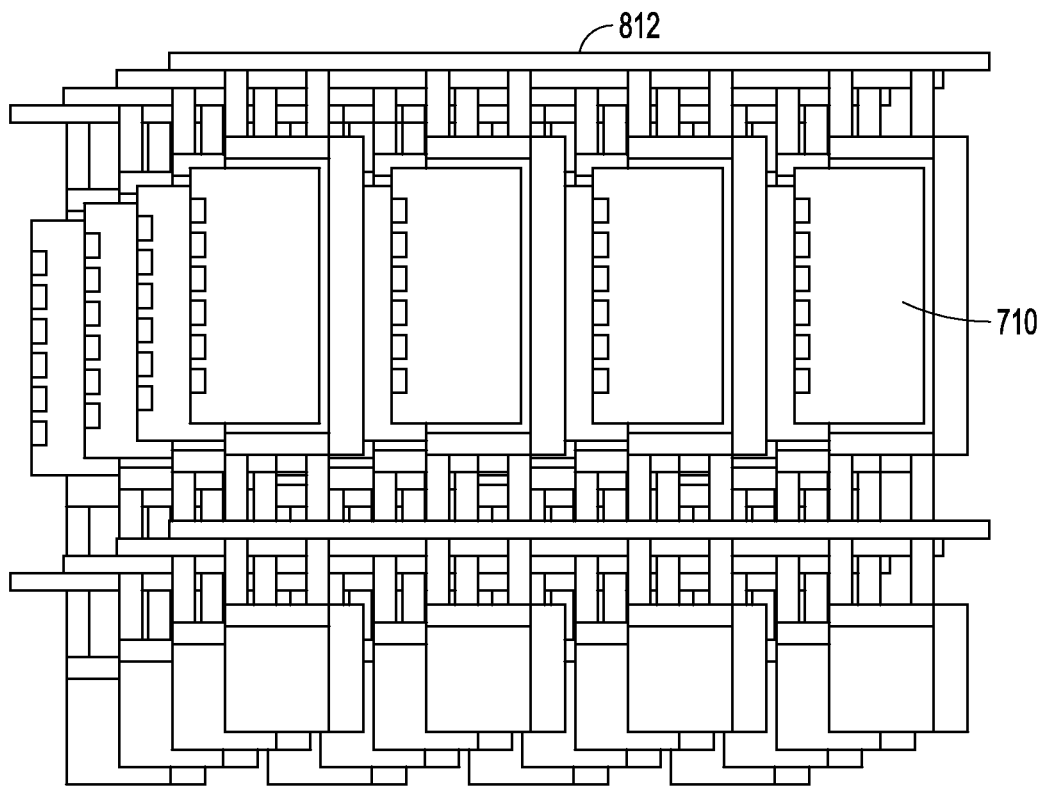
FIG. 41 is a conceptual drawing illustrating an example of multiple lead frame assemblies.

FIG. 41 is a conceptual drawing illustrating an example of multiple lead frame assemblies. Solder paste can be dispensed on the high points of the lead frame assemblies 812. Multiple lead frame assemblies 812 can be stacked using a jig, for example. In the example shown, three (3) Type B frame assemblies (bottom-FETs) and one (1) Type A frame assembly (control and top-FET) can be stacked, and then the stacked assemblies can be run through a reflow oven.

Figure 42:
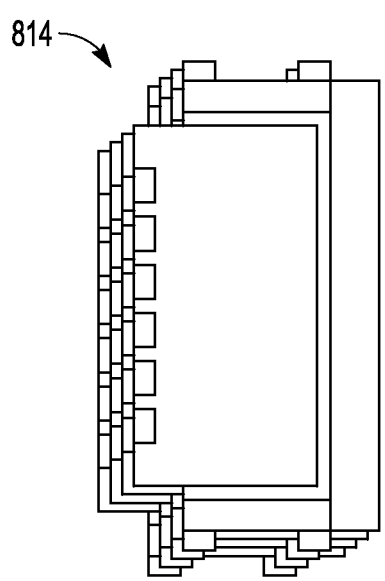
FIG. 42 is a conceptual drawing illustrating an example of one of the assemblies of FIG. 41 after separation

FIG. 42 is a conceptual drawing illustrating an example of one of the assemblies of FIG. 41 after separation, as shown at 814.

Figure 43:
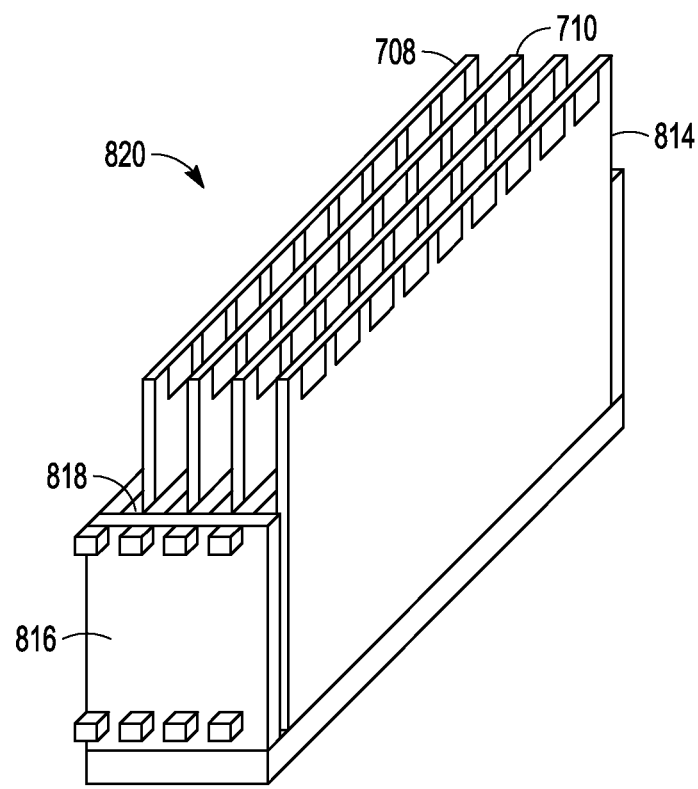
FIG. 43 is a conceptual drawing illustrating an example of the assembly of FIG. 42 positioned within a substrate to form a top assembly.

FIG. 43 is a conceptual drawing illustrating an example of the assembly 814 of FIG. 42 positioned within a substrate 816, e.g., aluminum or copper, to form a top assembly 820. In FIG. 43, the substrate 814 can include a plurality of slots 818, with the daughter switch assemblies 708, 710 positioned within corresponding slots 818. An epoxy, for example, can be used to secure the daughter switch assemblies 708, 710 in place. In addition to acting as a holder to hold the daughter switch assemblies 708, 710 in place in a vertical configuration relative to a base fabrication, the metal substrate 816 can act as a heat sink to dissipate heat generated by the power FETs. In some example configurations, the heat sink can dissipate enough heat to allow very high levels of current per DrMOS assembly, continuous operation.

Figure 44:
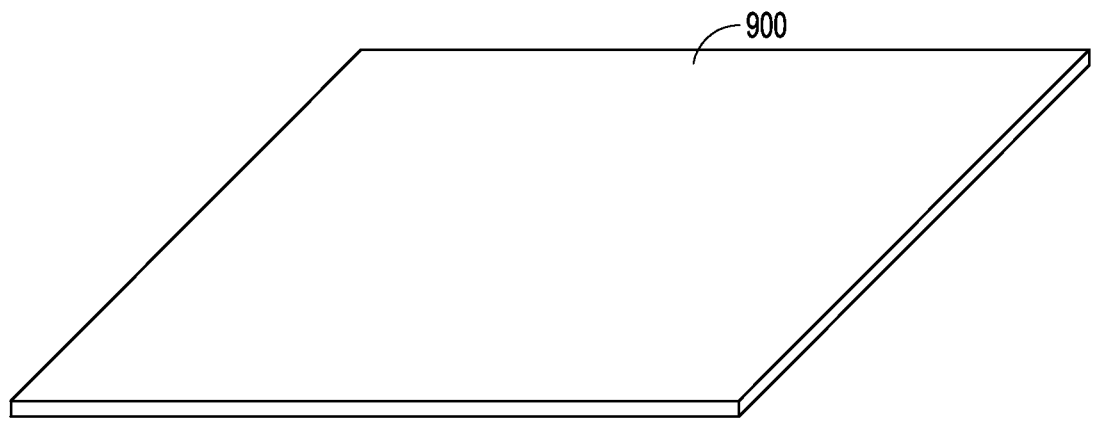
FIG. 44 is a conceptual drawing illustrating an example of a base fabrication.

FIG. 44 is a conceptual drawing illustrating an example of a base fabrication. In some example configurations, the base fabrication 900 can include four metal layers. In the example configuration shown, the base fabrication 900 does not include the control and top-FET dies, which can be formed on a daughter fabrication, as described above. The base fabrication 900 can route power and signals from the top assembly of FIG. 43 to a PCB of a finished product.

Figure 45:
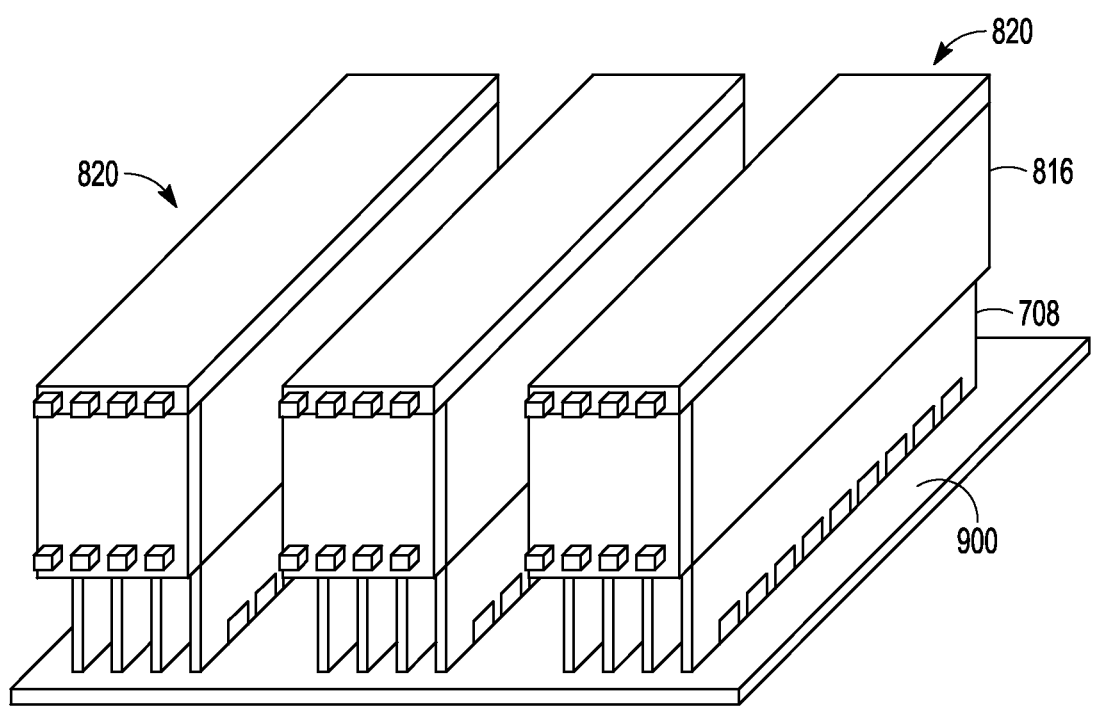
FIG. 45 is a conceptual drawing illustrating an example of a base fabrication in combination with multiple top assemblies.

FIG. 45 is a conceptual drawing illustrating an example of a base fabrication in combination with multiple top assemblies 820. Solder paste can be dispensed onto the base fabrication 900 before the top assemblies 820 are applied. Then, the combination can run through a reflow oven.

Figure 46:
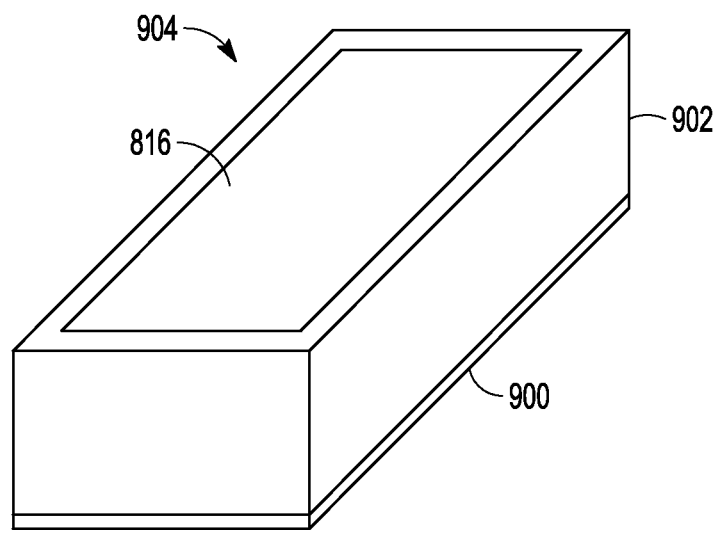
FIG. 46 is a conceptual drawing illustrating an example of the assembly of FIG. 45 molded with a material and separated as a finished high-power density DrMOS assembly.

FIG. 46 is a conceptual drawing illustrating an example of the assembly of FIG. 45 molded with a material 902 and separated as a finished high-power density DrMOS assembly 904. In some examples, molding can be performed using film-assisted mold to leave the top portion of the substrate 816, which acts as a heat sink, without any molding 902. In some example implementations, molding need not be used. If molding is not used, then air channels exist next to each of the daughter switch assemblies. If the top portion of the substrate 816 is desired to be exposed, another method is to use a strip grinding technique to expose the substrate area. This can be performed instead of using film assisted mold techniques.

Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. An electronic package comprising:
   a base fabrication, wherein the base fabrication is selected from a first group consisting of a laminate, a copper lead frame, and a molded interconnect substrate;
   a first fabrication coupled to a first die, wherein the first fabrication is selected from a second group consisting of a laminate, a copper lead frame, and a molded interconnect substrate; and
   a metal substrate including a first surface,
   wherein the first fabrication is coupled to the first surface of the metal substrate, wherein the first fabrication is electrically coupled to the base fabrication, and
   wherein the first fabrication extends away from the base fabrication such that the first die is oriented in a vertical position relative to the base fabrication.

2. The electronic package of claim 1, further comprising:
   a control and first switching element die mounted to the base fabrication.

3. The electronic package of claim 1, further comprising:
   a mold at least partially covering a surface of the base fabrication, the mold defining a slot configured to receive the first fabrication.

4. The electronic package of claim 1, further comprising a second fabrication coupled to a second die, wherein the second fabrication is selected from a third group consisting of a laminate, a copper lead frame, and a molded interconnect substrate.

5. The electronic package of claim 4, wherein the metal substrate is a first metal substrate, the electronic package further comprising:
   a second metal substrate having a second surface, wherein the second fabrication is coupled to the second surface; and
   a mold at least partially covering a surface of the base fabrication, the mold defining a slot configured to receive the first fabrication and the second fabrication.

6. The electronic package of claim 4, wherein the metal substrate includes a base and a second surface, wherein the second fabrication is coupled to the second surface, and wherein the first and second surfaces are perpendicular to the base of the metal substrate.

7. The electronic package of claim 6, wherein the metal substrate includes a plurality of first and second surfaces, wherein pairs of first and second surfaces define a slot therebetween, and wherein the first and second fabrications are positioned within the slots.

8. The electronic package of claim 4, wherein the metal substrate includes a base and a plurality of first and second surfaces, wherein the plurality of first and second surfaces extend at an angle other than 90 degrees to the base of the metal substrate, and wherein the first and second fabrications are coupled to corresponding first and second surfaces.

9. The electronic package of claim 1, wherein the base fabrication includes a vertically extending portion that includes the first surface, and wherein the vertically extending portion has a triangular-shaped cross-section.

10. The electronic package of claim 1, further comprising:
    a mold at least partially covering the base fabrication, the metal substrate, and the first fabrication.

11. A method of forming an electronic package, the method comprising:
    coupling a first fabrication to a first surface of a metal substrate, wherein the first fabrication is coupled to a first die, wherein the first fabrication is selected from a first group consisting of a laminate, a copper lead frame, and a molded interconnect substrate; and
    electrically coupling the first fabrication to a base fabrication, wherein the base fabrication is selected from a second group consisting of a laminate, a copper lead frame, and a molded interconnect substrate,
    wherein the first fabrication extends away from the base fabrication such that the first die is oriented in a vertical position relative to the base fabrication.

12. The method of claim 11, further comprising:
    mounting a control and first switching element die to the base fabrication.

13. The method of claim 11, further comprising:
    applying a mold to at least partially cover a surface of the base fabrication, the mold defining a slot configured to receive the first fabrication.

14. The method of claim 11, further comprising:
    coupling a second die to a second fabrication.

15. The method of claim 14, further comprising:
    coupling the second fabrication to a second surface of a second metal substrate; and applying a mold to at least partially cover a surface of the base fabrication, the mold defining a slot configured to receive the first fabrication and the second fabrication.

16. The method of claim 14, wherein the metal substrate is a first metal substrate, wherein the metal substrate includes a base and a second surface, the method comprising:

coupling the second fabrication to the second surface, wherein the first and second surfaces are perpendicular to the base of the metal substrate, wherein the second fabrication is selected from a third group consisting of a laminate, a copper lead frame, and a molded interconnect substrate.

17. The method of claim 16, wherein the metal substrate includes a plurality of first and second surfaces, wherein pairs of first and second surfaces define a slot therebetween, the method comprising:

positioning the first and second fabrications within the slots.

18. The method of claim 14, wherein the metal substrate includes a base and a plurality of first and second surfaces, wherein the plurality of first and second surfaces extend at an angle other than 90 degrees to the base of the metal substrate, the method comprising:

coupling the first and second fabrications to corresponding first and second surfaces.

19. An electronic package comprising:

a base laminate;

a first laminate coupled to a first switching element die;

a second laminate coupled to a second switching element die; and one or more metal substrates having one or more surfaces, wherein the first laminate is coupled to a first one of the surfaces and the second laminate is coupled to a second one of the surfaces, wherein the first and second laminates are electrically coupled to the base laminate, and wherein the first and second laminates extend away from the base laminate such that their corresponding dies are oriented in a vertical position relative to the base laminate.

20. The electronic package of claim 19, further comprising:

a mold at least partially covering a surface of the base laminate, the mold defining a slot configured to receive the first and second laminates.

* * * * *